US011446750B2

(12) United States Patent
Zenou et al.

(10) Patent No.: US 11,446,750 B2
(45) Date of Patent: Sep. 20, 2022

(54) SYSTEMS FOR PRINTING SOLDER PASTE AND OTHER VISCOUS MATERIALS AT HIGH RESOLUTION

(71) Applicant: IO Tech Group Ltd., London (GB)

(72) Inventors: Michael Zenou, Hashmonaim (IL); Ziv Gilan, Kfar-harif (IL); Guy Nesher, Nes Ziona (IL)

(73) Assignee: IO Tech Group Ltd., London (GB)

(*) Notice: Subject to any disclaimer, the term of this patent is extended or adjusted under 35 U.S.C. 154(b) by 64 days.

(21) Appl. No.: 16/807,489

(22) Filed: Mar. 3, 2020

(65) Prior Publication Data

US 2021/0237184 A1 Aug. 5, 2021

Related U.S. Application Data

(60) Provisional application No. 62/969,233, filed on Feb. 3, 2020.

(51) Int. Cl.
*B41F 16/00* (2006.01)
*B05C 5/02* (2006.01)
(Continued)

(52) U.S. Cl.
CPC .............. *B23K 1/0016* (2013.01); *B05C 1/08* (2013.01); *B05C 1/0813* (2013.01); *B05C 5/02* (2013.01);
(Continued)

(58) Field of Classification Search
CPC ..... B29C 64/20; B29C 64/205; B29C 64/218; B29C 64/223; B29C 64/268;
(Continued)

(56) References Cited

U.S. PATENT DOCUMENTS 5,155,324 A 10/1992 Deckard et al.
5,204,055 A 4/1993 Sachs et al.
(Continued)

FOREIGN PATENT DOCUMENTS

DE 102011083627 A1 3/2013
DE 102017120750 A1 3/2019
(Continued)

OTHER PUBLICATIONS

International Preliminary Report on Patentability dated Jan. 14, 2022, from the IPEA/European Patent Office, for International Patent Application No. PCT/IB2021/050025 (filed May 1, 2021), 19 pgs.
(Continued)

*Primary Examiner* — Laura Edwards
(74) *Attorney, Agent, or Firm* — Ascenda Law Group, PC

(57) ABSTRACT

Systems and methods in which dot-like portions of a material (e.g., a viscous material such as a solder paste) are printed or otherwise transferred onto an intermediate substrate at a first printing unit, the intermediate substrate having the dot-like portions of material printed thereon is transferred to a second printing unit, and the dot-like portions of material are transferred from the intermediate substrate to a final substrate at the second printing unit. Optionally, the first printing unit includes a coating system that creates a uniform layer of the material on a donor substrate, and the material is transferred in the individual dot-like portions from the donor substrate onto the intermediate substrate at the first printing unit. Each of the first and second printing units may employ a variety of printing or other transfer technologies. The system may also include material curing and imaging units to aid in the overall process.

12 Claims, 14 Drawing Sheets

(51) Int. Cl.
| | |
|---|---|
| *B05C 1/08* | (2006.01) |
| *B05C 9/14* | (2006.01) |
| *H05K 3/00* | (2006.01) |
| *B05D 3/06* | (2006.01) |
| *B05D 1/26* | (2006.01) |
| *B05D 1/28* | (2006.01) |
| *B23K 1/00* | (2006.01) |
| *H05K 3/34* | (2006.01) |
| *B41M 3/00* | (2006.01) |
| *B23K 101/42* | (2006.01) |

(52) U.S. Cl.
CPC ............ *B05C 5/027* (2013.01); *B05C 5/0245* (2013.01); *B05C 9/14* (2013.01); *B05D 1/26* (2013.01); *B05D 1/28* (2013.01); *B05D 3/06* (2013.01); *B05D 3/065* (2013.01); *B41F 16/0073* (2013.01); *B41M 3/006* (2013.01); *H05K 3/34* (2013.01); *H05K 3/3478* (2013.01); *B23K 2101/42* (2018.08); *H05K 3/00* (2013.01); *H05K 2203/0338* (2013.01)

(58) Field of Classification Search
CPC ... B29C 64/295; B29C 64/379; B41F 16/006; B41F 16/0073; B41M 3/006; B41M 5/025; H05K 3/00; H05K 3/34; H05K 3/1275; H05K 3/3478; H05K 2203/0528; H05K 2203/0338; H05K 2203/0534; H05K 2203/163; H05K 2203/107; H05K 2203/0156; B05C 1/08; B05C 1/0813; B05C 1/14; B05C 5/0254; B05C 5/02; B05C 5/0245; B05C 5/027; B05C 5/0291; B05C 9/06; B05C 9/14; B05C 11/04; B23K 1/0016; B23K 3/0638; B23K 3/082; B23K 2101/42
USPC .................................................. 118/257, 304
See application file for complete search history.

(56) References Cited

U.S. PATENT DOCUMENTS

| | | | |
|---|---|---|---|
| 5,236,637 A | 8/1993 | Hull | |
| 5,436,083 A | 7/1995 | Haluska et al. | |
| 5,506,607 A | 4/1996 | Sanders, Jr. et al. | |
| 5,740,051 A | 4/1998 | Sanders, Jr. et al. | |
| 5,837,960 A | 11/1998 | Lewis et al. | |
| 6,122,036 A | 9/2000 | Yamasaki et al. | |
| 6,537,359 B1 | 3/2003 | Spa | |
| 7,198,736 B2 | 4/2007 | Kasuga et al. | |
| 7,438,846 B2 | 10/2008 | John | |
| 7,658,603 B2 | 2/2010 | Medina et al. | |
| 7,892,474 B2 | 2/2011 | Shkolnik et al. | |
| 8,236,373 B2 | 8/2012 | Fumo et al. | |
| 8,252,223 B2 | 8/2012 | Medina et al. | |
| 8,740,040 B2 | 6/2014 | Choi et al. | |
| 9,636,873 B2 | 5/2017 | Joyce | |
| 9,808,822 B2 | 11/2017 | Martensson et al. | |
| 9,901,983 B2 | 2/2018 | Hovel et al. | |
| 10,144,034 B2 | 12/2018 | Zenou | |
| 2004/0101619 A1* | 5/2004 | Camorani | B28B 11/048 118/308 |
| 2005/0109734 A1 | 5/2005 | Kuriyama et al. | |
| 2005/0212888 A1 | 9/2005 | Lehmann et al. | |
| 2007/0164089 A1 | 7/2007 | Gaugler | |
| 2007/0201122 A1 | 8/2007 | Dozeman et al. | |
| 2008/0166490 A1* | 7/2008 | Hogan | H05K 3/0091 427/422 |
| 2009/0074987 A1 | 3/2009 | Auyeung et al. | |
| 2009/0217517 A1 | 9/2009 | Pique et al. | |
| 2009/0274833 A1 | 11/2009 | Li et al. | |
| 2011/0017841 A1 | 1/2011 | Holm et al. | |
| 2013/0176700 A1 | 7/2013 | Stevens et al. | |
| 2013/0224474 A1 | 8/2013 | Theunissen et al. | |
| 2015/0033557 A1 | 2/2015 | Kotler et al. | |
| 2015/0239236 A1 | 8/2015 | Stefani et al. | |
| 2016/0233089 A1 | 8/2016 | Zenou et al. | |
| 2017/0120260 A1* | 5/2017 | Oetjen | B05C 1/10 |
| 2017/0189995 A1 | 7/2017 | Zenou et al. | |
| 2017/0210142 A1* | 7/2017 | Kotler | B41J 2/455 |
| 2017/0250294 A1 | 8/2017 | Zenou et al. | |
| 2017/0306495 A1 | 10/2017 | Kotler et al. | |
| 2017/0348908 A1 | 12/2017 | Liu et al. | |
| 2018/0015502 A1 | 1/2018 | Zenou | |
| 2018/0090314 A1 | 3/2018 | Kotler et al. | |
| 2018/0193948 A1 | 7/2018 | Zenou et al. | |
| 2018/0281243 A1 | 10/2018 | Zenou et al. | |
| 2019/0143449 A1 | 5/2019 | Zenou | |
| 2019/0150292 A1 | 5/2019 | Tsukada et al. | |
| 2019/0322036 A1 | 10/2019 | Zenou et al. | |
| 2020/0350275 A1 | 11/2020 | Zenou et al. | |
| 2021/0028141 A1 | 1/2021 | Zenou et al. | |
| 2021/0267067 A1 | 8/2021 | Ziv et al. | |
| 2021/0385951 A1 | 12/2021 | Zenou | |
| 2022/0040912 A1 | 2/2022 | Zenou et al. | |

FOREIGN PATENT DOCUMENTS

| | | |
|---|---|---|
| EP | 1213083 A2 | 6/2002 |
| EP | 3032933 A1 | 6/2016 |
| EP | 3089573 A1 | 11/2016 |
| EP | 3 219 412 A1 | 9/2017 |
| EP | 3468312 A1 | 4/2019 |
| JP | H01 221466 A | 9/1989 |
| WO | 01/72489 A2 | 10/2001 |
| WO | 2007/020644 A1 | 2/2007 |
| WO | 2007/026366 A1 | 3/2007 |
| WO | 2007/084888 A2 | 7/2007 |
| WO | 2014/078537 A1 | 5/2014 |
| WO | 2014/113937 A1 | 7/2014 |
| WO | 2014/126837 A2 | 8/2014 |
| WO | 2015/144967 A2 | 10/2015 |
| WO | 2015/192146 A1 | 12/2015 |
| WO | 2016/020817 A1 | 2/2016 |
| WO | 2016/124708 A1 | 8/2016 |
| WO | 2016/198291 A1 | 12/2016 |
| WO | 2018/003000 A1 | 1/2018 |
| WO | 2018/104432 A1 | 6/2018 |
| WO | 2018/136480 A1 | 7/2018 |
| WO | 2018/216002 A1 | 11/2018 |

OTHER PUBLICATIONS

International Search Report and Written Opinion dated Apr. 16, 2021, from the ISA/European Patent Office, for International Patent Application No. PCT/IB2021/050025 (filed Jan. 5, 2021), 13 pgs.
International Search Report and Written Opinion dated Jun. 24, 2020, from the ISA/European Patent Office, for International Patent Application No. PCT/IB2020/053827 (filed Apr. 22, 2020), 15 pages.
Written Opinion of the International Preliminary Examining Authority dated Mar. 19, 2021, from the IPEA/European Patent Office, for International Patent Application No. PCT/IB2020/053827 (filed Apr. 22, 2020), 6 pgs.
International Search Report and Written Opinion dated Apr. 1, 2021, from the ISA/European Patent Office, for International Patent Application No. PCT/IB2021/050026 (filed Jan. 5, 2021), 13 pgs.
Non-Final Office Action dated Jan. 28, 2022, for U.S. Appl. No. 17/302,449 (filed May 3, 2021), 10 pgs.
International Preliminary Report on Patentability dated Jul. 27, 2021, from the IPEA/European Patent Office, for International Patent Application No. PCT/IB2020/053827 (filed Apr. 22, 2020), 37 pgs.
Nritten Opinion of the International Preliminary Examining Authority dated Jan. 5, 2022, from the IPEA/European Patent Office, for International Patent Application No. PCT/I82021/050026 (filed May 1, 2021), 8 pgs.

(56) References Cited

OTHER PUBLICATIONS

International Search Report and Written Opinion dated Apr. 29, 2021, from ISA/European Patent Office, for International Patent Application No. PCT/182021/050027 (filed Jan. 5, 2021), 11 pgs.
Amendment filed Apr. 4, 2022, for U.S. Appl. No. 17/302,449 (filed May 3, 2021), 10 pgs.
Non-Final Office Action dated May 9, 2022, for U.S. Appl. No. 15/949,281 (filed Apr. 22, 2020), 11 pgs.
Notice of Allowance dated Jun. 16, 2022, for U.S. Appl. No. 16/807,489 (filed Mar. 3, 2020), 9 pgs.
Final Office Action dated Jun. 9, 2022, for U.S. Appl. No. 17/302,449 (filed May 3, 2021), 11 pgs.
Non-Final Office Action dated Jun. 23, 2022 for U.S. Appl. No. 17/247,781 (filed Jan. 4, 2021), 14 pgs.
International Preliminary Report on Patentability dated Jun. 15, 2022, from the IPEA/European Patent Office, for International Patent Application No. PCT/IB/2021/050026 (filed Jan. 5, 2021), 6 pgs.
Amendment filed Jul. 5, 2022, for U.S. Appl. No. 17/247,981 (filed Jan. 4, 2021), 8 pgs.
International Preliminary Report on Patentability dated Jul. 5, 2022, from the IPEA/European Patent Office, for International Patent Application No. PCT/IB021/050027 (filed Jan. 5, 2021), 6 pgs.
Amendment filed Jul. 14, 2022, for U.S. Appl. No. 15/929,281 (filed Apr. 22, 2020), 10 pgs.

\* cited by examiner

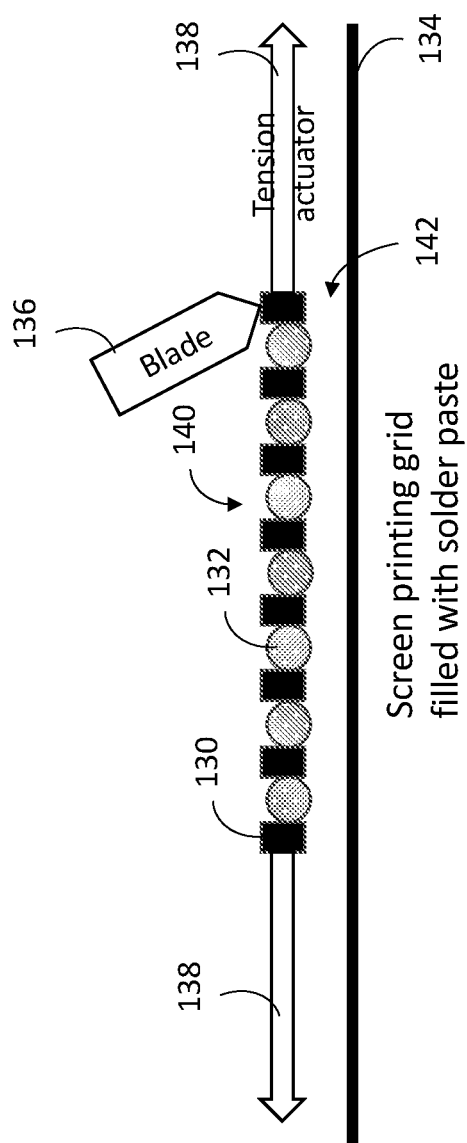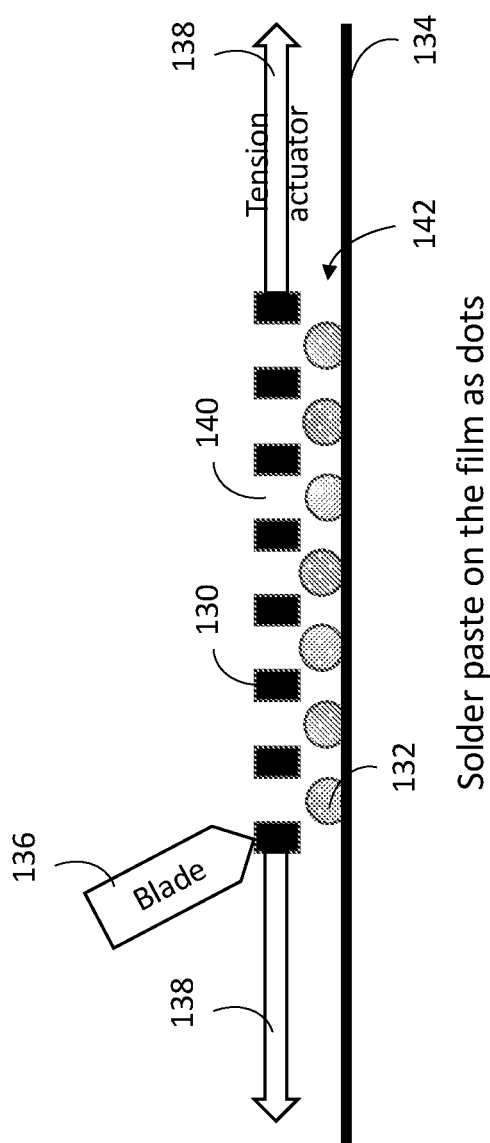

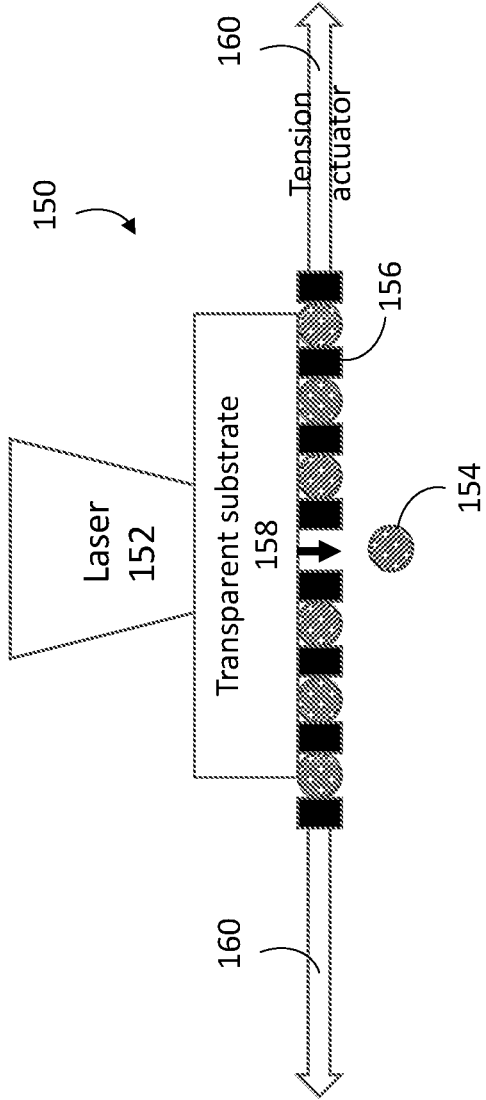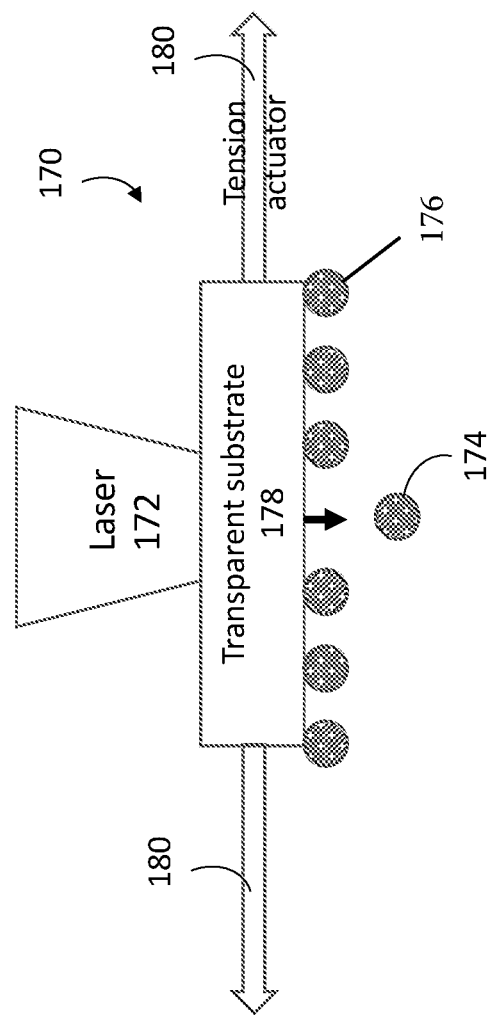

SYSTEMS FOR PRINTING SOLDER PASTE AND OTHER VISCOUS MATERIALS AT HIGH RESOLUTION

RELATED APPLICATIONS

This application is a NONPROVISIONAL of, claims priority to, and incorporates by reference U.S. Provisional Application No. 62/969,233, filed 3 Feb. 2020.

FIELD OF THE INVENTION

The present invention relates to systems and methods for printing a viscous material, such as solder paste, in which an initial printing of the viscous material to a film is performed at a moderate printing quality and a subsequent transferring of the printed viscous material from the film to a substrate is performed by a laser assisted deposition/laser dispensing system at a high resolution and high speed.

BACKGROUND

Surface Mount Technology (SMT) is an area of electronic assembly used to mount electronic components to the surface of a printed circuit board (PCB) as opposed to inserting components through holes in the PCB as in conventional assembly. SMT was developed to reduce manufacturing costs and allow efficient use of PCB space. As a result of the introduction of surface mount technology and ever increasing levels of automation, it is now possible to build highly complex electronic circuits into smaller and smaller assemblies with good repeatability.

The surface mount soldering process involves placing the electrical contact of an electronic component or substrate, a small amount of solder paste, and a solder-wettable pad on a printed circuit board in proximity to one another. The materials are then heated until the solder reflows, forming an electrical connection between the solder-wettable pad and the electrical contact of the electronic component. Once the solder has reflowed, it forms both an electrical and a mechanical connection between the electronic component and the printed circuit board. This process has numerous advantages over other methods of interconnection because components can be interconnected simultaneously and the process is repeatable, low cost, and easy to adapt for mass production.

One of the most important parts of the surface mount assembly process is the application of solder paste to the printed circuit board. The aim of this process is to accurately deposit the correct amount of solder onto each of the pads to be soldered. This is achieved generally by screen-printing the solder paste through a stencil or foil but also may be done by jet printing. It is widely believed that this part of the process, if not controlled correctly, accounts for most of the assembly defects.

Solder paste itself is a mixture of a flux composition and a powdered solder metal alloy that is widely used in the electronics industry. At room temperature the solder paste is compliant enough so that it can be made to conform to virtually any shape. At the same time, it is "tacky" enough that it tends to adhere to any surface it is placed into contact with. These qualities make solder paste useful for both surface mount soldering and for forming solder bumps on electronic components such as ball grid array packages or on a printed circuit board.

The solder paste printing is a very critical stage in current surface mount assembly processes. When a stencil or a film is used for the printing there are several possible items that can negatively impact the procedure resulting in defects in the end product. For example, the stencil itself should be very accurate: a stencil that is too thick will cause a solder bridge short while a stencil that is too thin will cause insufficient solder to be applied. Similarly, when the stencil aperture size is too big, a solder bridge short can occur but when the stencil aperture size is too small insufficient solder paste will be applied. It is generally considered best to use a circular-shaped stencil aperture sized slightly smaller than the PCB pad size, preventing a bridging defect during reflow. Nevertheless, defects can occur in stencil production.

The blade used for the screen printing should also be optimized: the blade angle affects the vertical force applied on the solder paste. If the angle is too small, the solder paste will not be squeezed into the stencil apertures. If the blade pressure is too small, it will prevent the solder paste from being cleanly applied to the stencil and if it is too high, it will result in more paste leakage.

Another crucial point is that the higher the printing speed the less time will be spent in applying the solder paste through the stencil aperture surface and, therefore, a higher printing speed may cause insufficient solder to be applied. In current processes, the printing speed should be controlled to around 20–40 mm/s and, therefore, the maximum speed is currently limited by the printing process.

The use of jet printing for the process is limited since the solder paste is a highly viscous thixotropic material and, therefore, jetting is quite complicated since most jetting heads are designed for low viscosity materials and are highly susceptible to clogging. However, jetting and dispensing is a very promising approach as can be seen from the extensive work in this field. See, for instance: WO 2007/084888 A2, US PGPUB 2011/0017841 A1, U.S. Pat. No. 9,808,822 B2, and U.S. Pat. No. 8,740,040 B2. Although promising, jetting of a viscous material produces unwanted debris to some extent as well as the formation of defects in the final assembly.

SUMMARY OF THE INVENTION

The present inventors have recognized that it is desirable to jet print a solder paste material (or any other viscous material), but to do so in a manner without causing defects in a final assembly. To that end, the inventors have developed systems and methods that segregate the jetting process and the application process, thereby addressing jetting failures while avoiding issues caused by screen-printing processes. In one embodiment of the invention, a solder paste printing system includes an initial printing to an intermediate substrate and a secondary, highly accurate, low to non-debris printing to a final substrate. The system may include one or more imaging arrangements for monitoring and control of the various processes. Curing arrangements may also be included for the final product as well as intermediate materials.

In some embodiments of the invention, the printing system includes a coating system that creates a uniform layer of the printed material on a substrate. Where present, the coating system may include a syringe of the printed material and an air or mechanical pump that drives the material onto a donor or carrier substrate. The donor substrate is then moved towards and through a well-defined gap between rollers or knives to create a uniform layer of the printed material with a thickness that is defined by the gap. Alternatively, the coating system may include a screen-printing module where the material is coated on a screen or stencil of film with well-defined holes and, using a blade or a squeegee, the material is transferred to a substrate in a soft or hard engage. In still further embodiments of the invention, the coating system may include a dispenser or an inkjet head to print the material onto a substrate, a gravure or microgravure system, a slot-die system, or a roller coating system that coats a substrate with a highly uniform layer of the material to be printed. The coating system may be housed inside a closed cell with a controlled environment (cold or hot) to prevent evaporation of solvent from the printed material or to prevent material oxidation, thereby prolonging the pot life of the material. Also, the coating system may contain more than one material, thereby creating a possibility for printing a plurality of materials onto the intermediate substrate in a controlled sequence and making it possible to print more than one material on the final substrate. Within the coating system, the donor substrate may be translatable, bidirectionally or otherwise, in a controlled manner, e.g., while opening a gap between coater rollers, creating the possibility for recoating the same area of the donor substrate with the printed material without contamination of the rollers and reducing or eliminating the amount of substrate consumed during the initial printing process, thereby preventing waste.

In various embodiments of the invention, the printed material may be a solder paste or other metal paste(s) used for printed electronics, a metal paste or a ceramic paste, a highly viscous material, a wax material, a polymer material or a mixture of a polymer and a monomer material, a sensitive low viscosity material, a material that can be cured by ultraviolet (UV) or visible light or by heating, or a material that can be dried.

Either or both of the first and/or second printing process(es) may use a laser-based system that contains a high frequency laser to enable jetting of the material from one substrate to another substrate. Either may use a laser assisted deposition/laser dispensing system rotated by 0-90 degrees or 90-180 degrees from a main axis of a gravitational field within which it is located, enabling simpler mechanics without reducing printing quality.

In some cases, the first printing process may use an inkjet head system that enables jetting the material directly to the intermediate substrate, a dispenser head system that enables printing the material directly to the intermediate substrate, or an offset printer module, a gravure printing module, or another printer module that enables printing the material directly to the intermediate substrate. Alternatively, the first printing process may use a screen-printing module in which the material is coated on a screen or stencil of film with well-defined holes and a blade or a squeegee is employed to transfer the material to a substrate in a soft or hard engage, creating an array of dots on the substrate. In some embodiments of the invention, after printing to the intermediate substrate in the first printing unit, the printed intermediate substrate may be further cured by UV light or dried by a heater and returned to the first printing unit for a second (or additional) layer printing.

In some embodiments of the invention, the first printing unit includes a gap control unit configured to maintain a very well-defined gap between the donor substrate and the intermediate substrate. For example, the very well-defined gap between the coated substrate and the intermediate substrate may be maintained by a plane of three actuators at corners of a control unit that allows both translation and rotation as mentioned in US PGPUB 2005/109734 A1, U.S. Pat. No. 6,122,036 A, WO 2016/198291, and EP 3,219,412 A1. Such actuators may be used at corners of a control unit for both the coated substrate and the intermediate substrate to allow both translation and rotation in two planes, where the two planes are independent or riding on each other.

In another embodiment of the invention, the very well-defined gap between the donor substrate and the intermediate substrate is achieved by providing a fixed support below the intermediate substrate which is part of the coating system framework. Or, the very well-defined gap between the coated substrate and the intermediate substrate may be achieved by using a transparent solid substrate instead of a film as an intermediate substrate.

In some embodiments of the invention, the intermediate substrate may be a continuous transparent film substrate, a transparent film substrate coated by a metal layer or by a metal and a dielectric layer, or a transparent solid substrate.

In some embodiments of the invention, after the first printing the intermediate substrate is moved, by motors, from a first printing unit toward a second printing unit. Thus, the intermediate substrate may be a continuous film substrate that, by rolling, can deliver the material printed at the first printing unit to the second printing unit. Or, the intermediate substrate may be a transparent solid substrate that can deliver the material printed at the first printing unit to the second printing unit by a robotic arm with optional change(s) in direction.

In some embodiments of the invention, during movement of the intermediate substrate from the first printing unit to the second printing unit the printed material is cured by UV light or dried by a heater. In addition, the printed image may be processed by an imaging system. Such an imaging system may be a microscope or a charge-coupled device (CCD) that takes a picture of printed material dots on the intermediate substrate and measures the dots in two dimensions, with the measurement data subsequently being transferred to the second printing unit for accurate deposition on the final substrate. Alternatively, the imaging system may be a three-dimensional (3D) microscope that takes a picture of the printed material dots on the intermediate substrate and measures the dots in three dimensions, with the measurement data subsequently being transferred to the second printing unit for accurate deposition on the final substrate. In still further embodiments of the invention, the imaging system is two microscopes or CCDs arranged such that one can image the printed material dots on the intermediate substrate and measure the dots in two dimensions (e.g., length and width) while the other measures the dots in a third dimension (e.g., height), with all of the measurement data subsequently being transferred to the second printing unit for accurate deposition on the final substrate. In any event, imaging systems may be included before and/or after the second printing unit and may capture images from the intermediate substrate, the final substrate, or from both. In one embodiment of the invention, an imaging system at the second printing unit may employ a mirror to obtain images from a surface of the intermediate substrate and/or a main laser channel of the second printing unit to image both the dots' dimensions and a target area of the final substrate simultaneously.

In some embodiments of the invention, the second printing unit may be a laser-based system that contains a high frequency laser to enable jetting of the dots from the intermediate substrate to the final substrate by laser jet release, a laser jet release system with a one-dimensional or two-dimensional (2D) array scan laser. Alternatively, in some cases the second printing unit may include only a deposition position where the intermediate substrate engages the final substrate directly. In any event, after printing to the final substrate in the second printing unit (or otherwise) the printed final substrate may be further cured by UV light or dried by a heater.

These and further embodiments of the invention are described in detail below.

BRIEF DESCRIPTION OF THE DRAWINGS

The present invention is illustrated by way of example, and not limitation, in the figures of the accompanying drawings, in which:

FIGS. 3a-3e illustrate alternative arrangements for a system configured in accordance with the schematic illustration shown in FIG. 2, in which FIG. 3a shows an example of such a system based on laser assisted deposition in a first printing unit, FIG. 3b shows an example of a similar system based on a gravure, non-digital printing system in the first printing unit, FIG. 3c shows additional details of an example configuration for the system, FIG. 3d shows additional details of another example configuration for the system showing no gravity limitation for the system, and FIG. 3e shows yet another configuration of the system with a translation of a transparent solid substrate.

FIGS. 5a and 5b illustrate an example of screen printing directly to a film substrate in accordance with some embodiments of the present invention.

FIG. 6 illustrates an example of a using laser assisted deposition/laser dispensing system to print a material from a grid substrate in accordance with some embodiments of the present invention.

FIG. 7 illustrates an example of a using laser jet release system to print a dotted material from a film substrate in accordance with some embodiments of the present invention.

DESCRIPTION OF THE INVENTION

Figure 1:
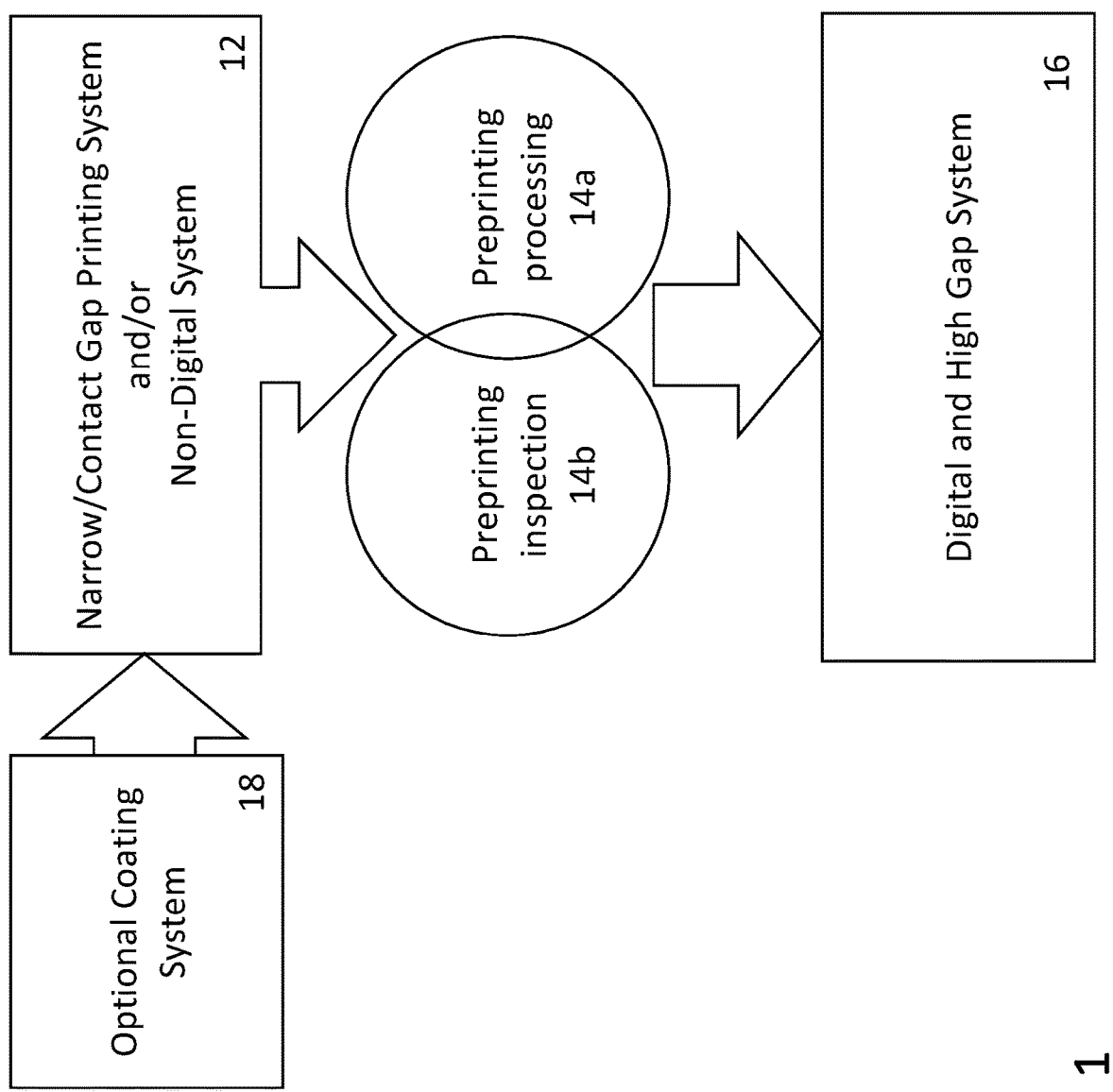
FIG. 1 illustrates, in a conceptual manner, a system configured in accordance with embodiments of the present invention which employs a narrow or contact gap printing system (or even a non-digital printing system), preprinting processing and/or inspection, and digital, high gap printing to provide high resolution and high speed printing of viscous materials such as solder paste.

Before describing the invention in detail, it is helpful to refer to FIG. 1 which provides a conceptual overview of a system 10 that employs a narrow or contact gap printing system (or even a non-digital printing system) 12, preprinting processing and/or inspection 14a, 14b, and digital, high gap printing 16 to provide high resolution and high speed printing of viscous materials such as solder paste, in accordance with embodiments of the invention. As further described below, the narrow or contact gap printing system 12 performs an initial printing of the viscous material to an intermediate substrate. As part of the preprinting processing and/or inspection 14a, 14b, the intermediate substrate may be observed by one or more imaging arrangements for monitoring and control of the initial and subsequent printing processes. Then, the intermediate substrate may be employed as part of a second, high gap printing 16 of the viscous material to a final substrate. This second printing procedure may also be observed by one or more imaging arrangements, is highly accurate, and forms little, if any, debris. In one implementation of this two-step printing procedure, the viscous material is distributed as dots (e.g., small, generally round spots or droplets) on the intermediate substrate by the first printing process, which then moves through an imaging system and to the second printing process where the dots (or at least some of them) are deposited on the final substrate.

The first printing process may be a laser assisted deposition or other laser dispensing printing, where dots of the viscous material are ejected from a uniform layer thereof on a coated substrate (e.g., a donor substrate) onto (or into) the intermediate substrate using a fast frequency laser. The jetting of the material is preferably conducted in a well-defined and robust way to minimize variations in dot sizes. To ensure the uniform coating of the viscous material onto the donor substrate, an optional coating system 18 may be used to coat the donor substrate before it is provided to the first printing unit at which the laser assisted deposition or other laser dispensing printing is performed. This coating system may be a traditional coating system such as a coating system based on a micro gravure or slot die coater or a roller coating system. Alternatively, the coating system may be a screen printing-based coating system, a dispenser, or an inkjet system. In still other embodiments, the coating system may be based on a syringe and a gap system in which the viscous material is dispensed from a syringe to a donor substrate which then passes through a well-defined gap, e.g., formed by blade of other kind of barrier, or a pair of rollers or cylinders. After passing through the gap, a uniform layer of the viscous material will be present on the donor substrate and the laser assisted deposition/laser dispensing system can jet dots of material from the coated, donor substrate to the intermediate substrate. After providing the uniform layer of viscous material for printing in the first printing process, the donor substrate can be returned to the coating system (e.g., in a loop or by linear translation) for recoating by the coating system to create a new uniform coted layer on the donor substrate for the next printing by the first printing process. The donor substrate may be a transparent film or other substrate, with or without a metal (or other) coating.

Systems configured in accordance with embodiments of the present invention may be used for printing a wide variety of liquid and/or paste materials. However, the present invention provides particular benefits for the printing of highly viscous materials that cannot be printed well in high resolution by other methods. For example, systems configured in accordance with embodiments of the present invention find particular application in printing solder pastes and other metal pastes, as well as high viscosity polymers, like acrylics, epoxies, and urethane-based adhesives, pastes or waxes. The present invention may also be employed in connection with the printing of sensitive materials since a coated, donor substrate can be maintained in a controlled environment prior to the first printing process so as to avoid solvent evaporation or oxidation of the material to be printed. Such a space may also provide a controlled area for temperature-sensitive materials.

The first printing process need not necessarily employ a laser assisted deposition/laser dispensing system. In some embodiments the first printing process may employ a dispenser or an inkjet head, or it could employ conventional 2D printing techniques such as offset printing, gravure printing, or other printing techniques. The first printing process may also be performed using screen printing or a combination of these techniques.

The second printing process, in which the viscous material is transferred from the intermediate substrate to the final substrate may make use of a laser jet release system. For example, where the viscous material exists in the form of dots on the intermediate substrate, a printing head in the form of a laser jet release system may be used to selectively transfer some or all of the dots of viscous material from the intermediate substrate to the final substrate. The laser jet release system may include a high frequency laser arranged to scan the intermediate substrate in two dimensions to jet the dots from the intermediate substrate to the final substrate. Alternatively, a direct transfer system may be used in which the intermediate substrate engages the final substrate directly to transfer the dots of viscous material therebetween. After printing to the final substrate, the viscous material may be cured by UV or infra-red light or dried by a heater.

Figure 2A:
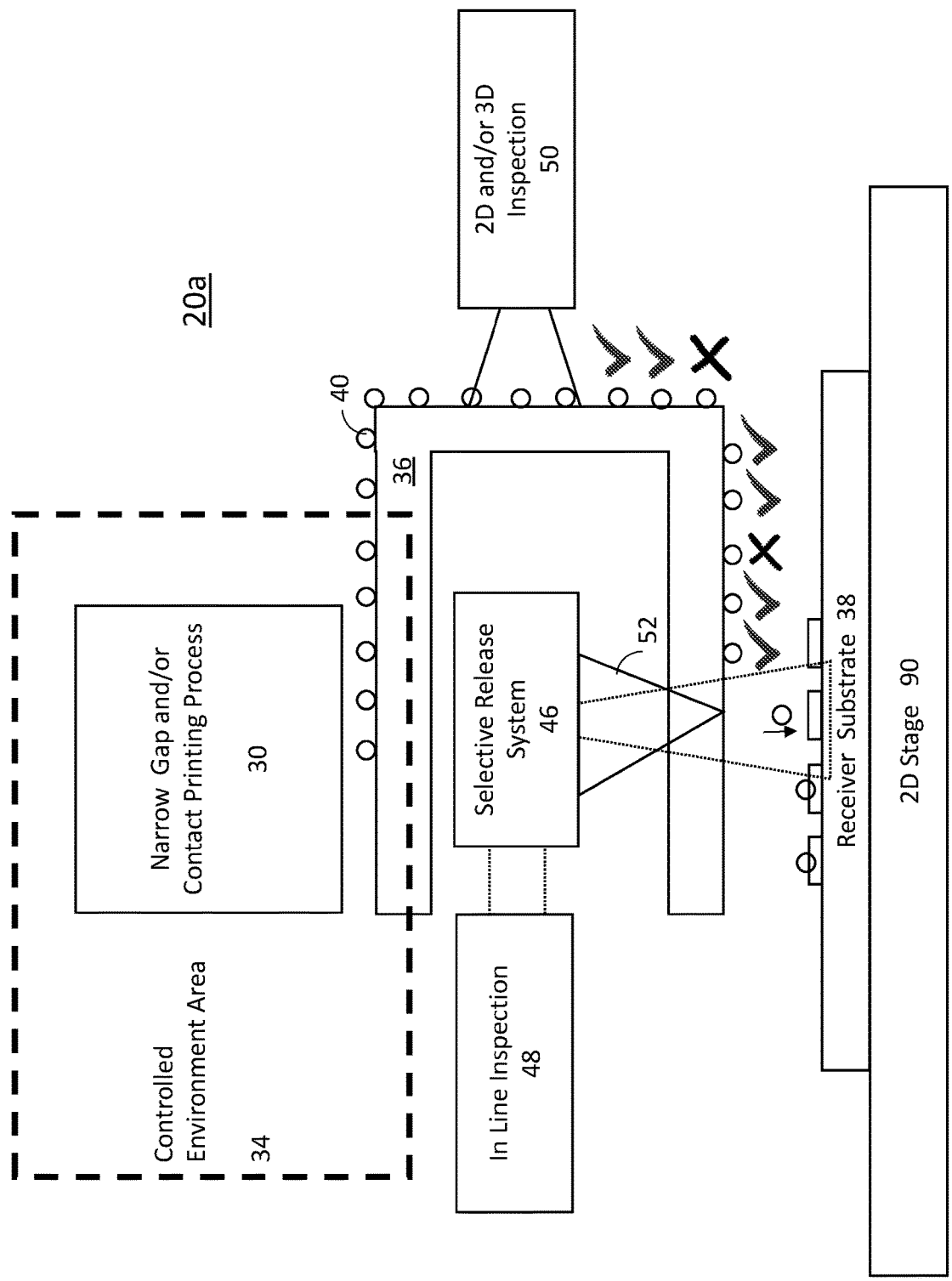
FIGS. 2a and 2b illustrate schematically aspects of a system configured in accordance with the conceptual overview presented in FIG. 1.
Figure 2B:
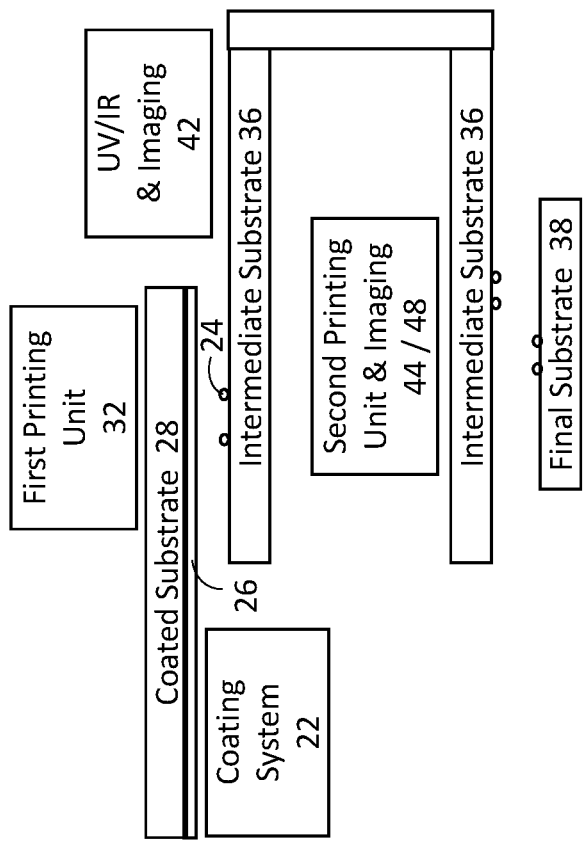

FIGS. 2a and 2b illustrate schematically aspects of systems 20a, 20b configured in accordance with the conceptual overview presented in FIG. 1. Each of these systems segregate the viscous material jetting process from the application process, thereby addressing jetting failures while avoiding issues caused by conventional printing processes. The respective systems include one or more imaging arrangements for monitoring and control of the jetting and application processes. In FIG. 2b, the printing system 20b includes a coating system 22 that creates a uniform layer 26 of the to-be printed material (e.g., a highly viscous material such as a solder paste or other metal paste(s) used for printed electronics, a ceramic paste, a wax material, a polymer material or a mixture of a polymer and a monomer material, or a sensitive low viscosity material) on a donor substrate 28.

In one embodiment of the invention, the coating system 22 includes a syringe of the to-be printed material and an air or mechanical pump that drives the material onto the donor substrate 28. The donor substrate 28 is then moved, using motors, toward a well-defined gap between rollers or knives to create a uniform layer 26 of the to-be printed material with a thickness that is defined by the gap. In some embodiments of the invention, the donor substrate 28 can translate bidirectionally in a controlled manner, while opening the gap between the coater rollers, creating the possibility for recoating the same area of the donor substrate with the to-be printed material without contamination to the rollers and reducing or eliminating the amount of substrate consumed during the initial printing process, thereby preventing waste.

In further embodiments, coating system 22 may include a screen-printing module where the donor substrate 28 is coated using a screen or stencil with well-defined holes, the viscous material being applied thereto using a blade or a squeegee, with the viscous material being later transferred to the donor substrate 28 in a soft or hard engage. Alternatively, coating system 22 may include a dispenser or an inkjet head to print the viscous material onto donor substrate 28. Or, the coating system 22 may be a gravure or micro-gravure system that coats donor substrate 28 with a highly uniform layer 26 of the material to be printed. In one embodiment of the invention, coating system 22 is a slot-die system that coats donor substrate 28 with a highly uniform layer 26 of the material to be printed. In another embodiment of the invention, coating system 22 is a roller coating system that coats donor substrate 28 with a highly uniform layer 26 of the material to be printed. Although not shown in detail, the printing system 20a of FIG. 2a may also include a coating system as part of a narrow gap/contact printing process 30, which forms the first printing process described above.

As shown in FIG. 2a, in one embodiment of the invention the narrow gap/contact printing process 30, which may include a first printing unit 32 and, optionally, a coating system 22, is housed inside a closed cell with a controlled environment 34 (cold or hot) to prevent evaporation of solvent from the to-be printed material or to prevent material oxidation, thereby prolonging the pot life of the material. In some embodiments of the invention, the coating system 22 contains more than one material, thereby creating a possibility for printing a plurality of materials onto an intermediate substrate 36 in a controlled sequence and making it possible to print more than one material on a final substrate 38.

The first printing unit 32 produces areas 24 of the to-be printed material on the intermediate substrate 36. In one embodiment of the invention, a continuous transparent film substrate is used as an intermediate substrate 36 for the system. Alternatively, a transparent film substrate coated by a metal layer or by a metal and a dielectric layer may be used as an intermediate substrate 36 for the system.

The first printing unit 32 used in the narrow gap/contact printing process 30 may include a laser-based system that contains a high frequency laser configured to jet portions of the layer of coated material 26 from the donor substrate 28 to intermediate substrate 36 by a laser assisted deposition/laser dispensing system. The laser assisted deposition/laser dispensing system may be rotated by 0-90 degrees or 90-180 degrees from a main axis of a gravitational field within which it is located, enabling simpler mechanics without reducing printing quality.

Alternatively, where no coating system is used, the first (e.g., narrow gap/contact) printing process 30 may employ an inkjet head system that enables jetting the to-be printed material directly to the intermediate substrate 36. Alternatively, the first printing process may use a dispenser head system that enables printing the material directly to the intermediate substrate 36. Or, the first printing process may use an offset printer module, a gravure printing module, or any conventional printing technique to print the material directly to the intermediate substrate 36. For example, the first printing process may use a screen-printing module where the to-be printed material is coated on a screen or stencil of film with well-defined holes and a blade or a squeegee is employed to transfer the material to the intermediate substrate 36 in a soft or hard engage, creating an array of dots of to-be printed material 40 on the intermediate substrate 36.

In some embodiments of the invention, the first printing unit 32 employed in the narrow gap printing process 30 includes a very well-defined gap control unit between the donor substrate 28 and the intermediate substrate 36. In one instance, the very well-defined gap between the donor substrate 28 and the intermediate substrate 36 is maintained using a set of three actuators at corners of a control unit that allows both translation and rotation, as described in US PGPUB 2005/109734 A1, U.S. Pat. No. 6,122,036 A, WO 2016/198291, and EP 3,219,412 A1, incorporated herein by reference. Sets of three actuator units may be used at corners of a control unit for both the donor substrate and the intermediate substrate to allow both translation and rotation in both planes, wherein the two planes are independent or riding on each other. Alternatively, the very well-defined gap between the donor substrate 28 and the intermediate substrate 36 may be maintained by providing a fixed support below the donor substrate and/or the intermediate substrate. Or, the very well-defined gap between the donor substrate 28 and the intermediate substrate 36 may be maintained by using a transparent solid substrate instead of a film as an intermediate substrate 36.

In some embodiments of the invention, after printing to the intermediate substrate 36 in the first printing unit 32, the printed intermediate substrate is returned to the first printing unit 32 for a second (or additional) layer printing of viscous material. In any event, after being printed with the viscous material (in the form of dots 40 or other areas 24) the intermediate substrate 36 is moved from the first printing unit 32 toward a second printing unit 44. In some cases, the second printing unit may be a selective release system 46 (e.g., a laser-based system) with an in-line inspection unit 48. The intermediate substrate may be moved by motors, e.g., where the intermediate system is a film or similar substrate, or where the intermediate substrate is a continuous film substrate, it may be moved by rolling to deliver the material printed at the first printing unit to the second printing unit. In one embodiment of the invention, the intermediate substrate 36 is a transparent solid substrate that can deliver the material printed at the first printing unit to the second printing unit using a robotic arm, with optional change(s) in direction therebetween.

In some embodiments of the invention, during movement of the intermediate substrate 36 from the first printing unit 32 to the second printing unit 44 the material printed on the intermediate substrate (which may be a material that can be cured by ultraviolet (UV) light or by heating) may be cured by UV light or dried by a heater. Furthermore, during the movement of the intermediate substrate 36 from the first printing unit 32 to the second printing unit 44, the material printed on the intermediate substrate may be processed by an imaging system 50.

Such an imaging system 50 may be one or more microscopes, charge-coupled devices (CCD), and/or other imaging components that takes a picture (or pictures) of the printed dots of material 40 on the intermediate substrate 36 and measures the dots in two dimensions or in three dimensions. For example, the imaging system 50 may include two microscopes or CCDs arranged such that one can image the printed dots on the intermediate substrate and measures the dots in two dimensions (e.g., length and width) while the other measures the dots in a third dimension (e.g., height). This measurement data may be subsequently transferred to the second printing unit 44 in order to ensure accurate deposition of the viscous material on the final substrate 38. For example, and as shown in FIG. 2a, the optical or other imaging inspection may reveal that while many of the dots 40 are suitable for transfer to the final substrate 38 (e.g., illustrated with a check mark in the figure), some of the dots 40 are misshapen or otherwise unsuitable for transfer to the final substrate 38 (e.g., illustrated with an "X" in the figure). A controller (not illustrated) having access to this data may then operate the second printing unit so as to omit transferring the unsuitable ones of the dots 40 to the final substrate.

Imaging systems may be included before and/or after the material transfer area of second printing unit 44 and may capture images from the intermediate substrate 36, the final substrate 38, or from both. In one embodiment of the invention, the imaging system is positioned at the second printing unit 44 and a mirror or other optical element employed to obtain images from the surface of the intermediate substrate 36 and/or a laser channel 52 of the second printing unit 44 may be used to image both the dots' dimensions and the final substrate print area simultaneously using the in-line inspection system 48.

As mentioned above, the second printing unit 44 may be a laser-based system, for example one that contains a high frequency laser configured to jet the suitable ones of the dots 40 of material from the intermediate substrate 36 to the final substrate 38 (under the control of a controller) by laser jet release. In some embodiments of the invention, the second printing unit may be a laser jet release system with a two-dimensional (2D) array scan laser configured to scan a laser beam in a raster-like pattern over the intermediate substrate 36 as it passes through a target area, releasing suitable ones of the dots 40 of material onto the final substrate 38. Such a laser jet release system may be rotated by 0-90 degrees or 90-180 degrees from a main axis of a gravitational field within which it is located, enabling simpler mechanics without reducing printing quality.

In some embodiments of the invention, there is no second printing unit per se but only a deposition position where the intermediate substrate 36 engages the final substrate 38 directly and the dots 40 of material are transferred between the intermediate substrate 36 and the final substrate 38 through such contact. In either instance (laser transfer or direct contact transfer), after printing to the final substrate the printed material may be further cured by UV light or dried by a heater.

Figure 3A:
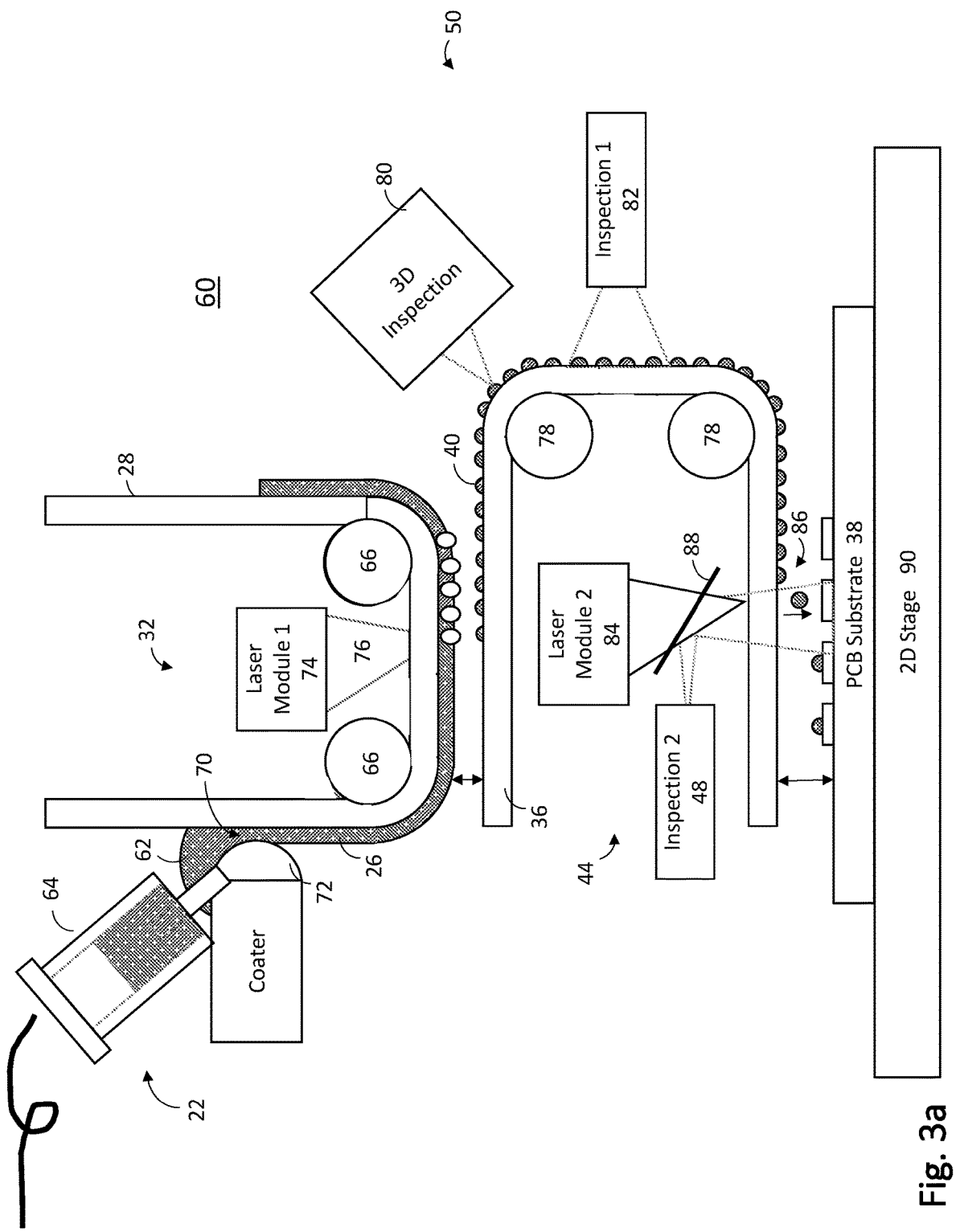

FIG. 3a illustrates one example of a system 60 configured in accordance with the present invention. System 60 instantiates aspects of systems 20a and 20b, described above. In particular, system 60 includes a coating system 22 that creates a uniform layer 26 of the to-be printed material on a donor substrate 28 using an air or mechanical pump (not shown) to drive the material 62 from a reservoir, e.g., a syringe 64, onto the donor substrate 28. The donor substrate 28 is then moved, using rollers or gears 66, toward a well-defined gap 70 between rollers or knives 72 to create a uniform layer 26 of the to-be printed material on the donor substrate 28 with a thickness that is defined by gap 70.

System 60 also includes a first printing unit 32 configured to produce dots 40 of the material 62 on the intermediate substrate 36. In this example, the donor substrate 28 may be a transparent film and the first printing unit 32 includes a first laser module 74 that contains a high frequency laser arranged to jet portions of the layer of coated material 26 from the donor substrate 28 to form dots 40 on intermediate substrate 36 by focusing a laser beam onto the interface between the layer of material 26 and the intermediate substrate 36. The incident laser beam causes local heating followed by a phase change and high local pressure which drives jetting of the print material onto the intermediate substrate 36. After printing to the intermediate substrate 36 in the first printing unit 32, the printed intermediate substrate can be returned for a second (or additional) layer printing of material 62 by reversing the direction of rollers or gears 66 or continuing the movement of intermediate substrate 36 through the coating system 22 in a loop-like process.

Alternatively, the donor substrate 26 may be a screen or grid in which the material 62 is introduced into holes of the screen by coater 72, which may be a roller or blade. In such cases, the incident laser beam from laser module 74 causes the print material to be displaced from the holes in the screen onto the intermediate substrate 36.

Once the dots 40 are printed on the intermediate substrate 36, the dots are moved, e.g., by moving the intermediate substrate 36 using roller or gears 78, toward a second printing unit 44. Although not illustrated in this drawing, the intermediate substrate may be a film substrate that is moved in a continuous loop-like fashion so that dots of material may be printed thereon at the first printing unit 32, subsequently transferred to the final substrate 38 at the second printing unit 44, and the now bare intermediate substrate returned to the transfer area of the first printing unit 32 to receive new dots 40 of material.

During movement of the intermediate substrate 36 from the first printing unit 32 to the second printing unit 44, the dots 40 of material may be cured by UV light or dried by a heater. Furthermore, during the movement of the intermediate substrate 36 from the first printing unit 32 to the second printing unit 44, the dots of material printed on the intermediate substrate may be processed by an imaging system 50. That includes one or more 3D 80 and/or 2D 82 imaging components that take pictures of the printed dots 40 of material and measure the dots in two dimensions or three dimensions. This measurement data may be used by the second printing unit 44 in order to ensure accurate deposition of the material on the final substrate 38.

The second printing unit 44 may include a laser module 84 with an in-line inspection unit 48. As the intermediate substrate 36 is moved to a target area 86 of the second printing unit 44, the laser module 84 is activated to emit a laser beam incident on the intermediate substrate 36 in order to deliver the material printed at the first printing unit to the final substrate 38. The in-line inspection unit 48 positioned at the second printing unit 44 includes a mirror 88 or other optical element employed to obtain images from the surface of the intermediate substrate 36 to assist in alignment of the final substrate below the target area 86 via a stage 90 configured to move in two or three dimensions, as well as to help synchronize the pulsing of the laser module 84 at times when the dots 40 of material on the intermediate substrate 36 are in the target area 86. In some embodiments of the invention, the laser module 84 of the second printing unit 44 may be configured to scan the laser beam in a raster-like pattern over the intermediate substrate 36 as it passes through a target area 86, releasing suitable ones of the dots 40 of material onto the final substrate 38. The material can go through a UV curing system and/or a drying system on its way to the second printing unit 44, and/or UV curing and/or drying can be used after the material is printed on the final substrate 38.

Figure 3B:
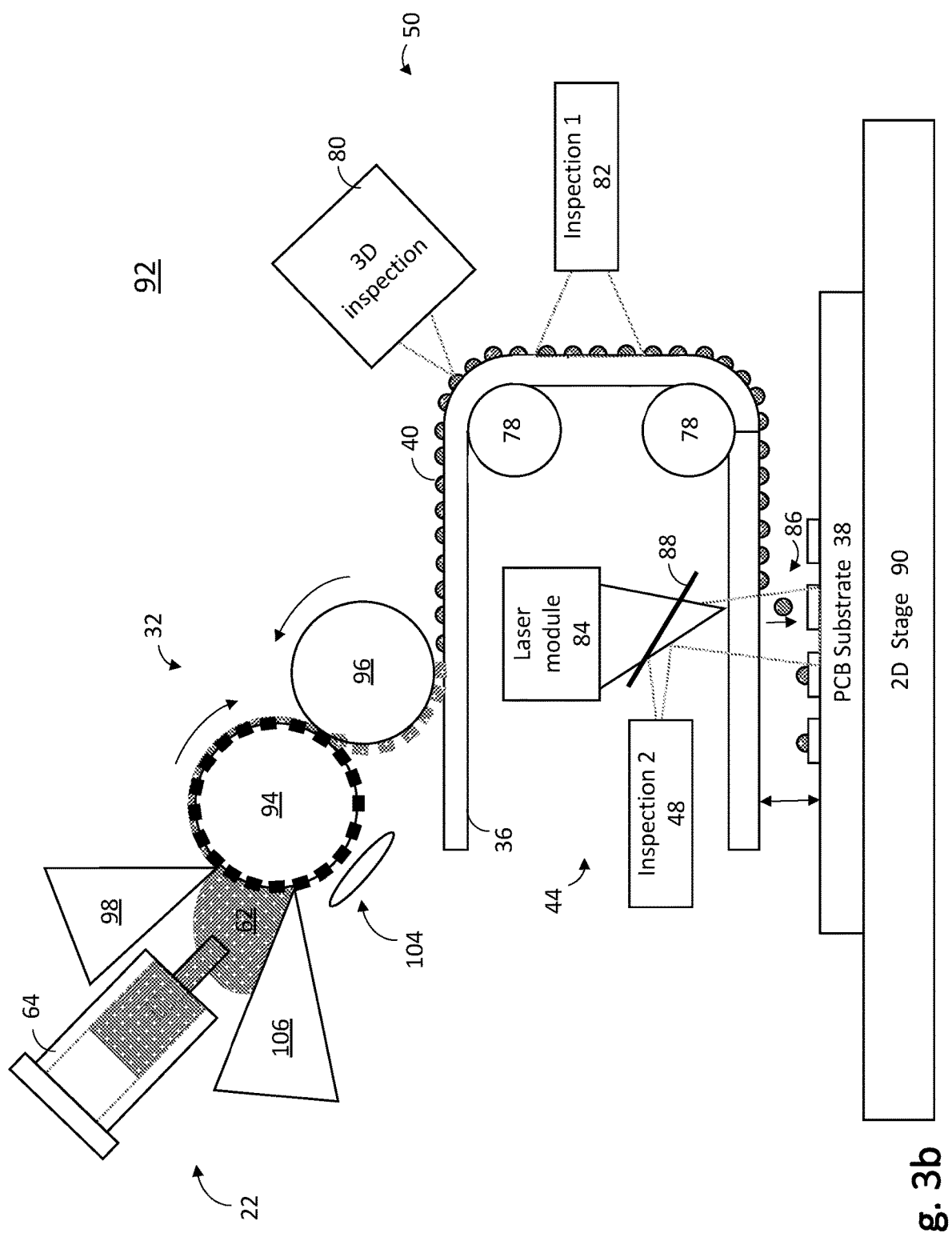

An alternative arrangement of the first printing unit 32 is shown in FIG. 3b. In this example, a system 92 configured in accordance with the present invention includes a coating system 22 in which the material 62 is driven from a reservoir, e.g., a syringe 64, using an air or mechanical pump (not shown) onto a roller 94. The material layer on roller 94 is kept uniform in thickness using one or more knives 98 displaced a defined distance above the surface of roller 94. Roller 94 may be dimpled or otherwise formed with recesses to contain defined amounts of the material to be printed, which amounts are transferred to a printing roller 96 as the two rollers contact one another in a material transfer area 100. Alternatively, the roller 94 may have a screen or grid-like surface with holes into which the material 62 is introduced. Roller 96 may contact the screen, effecting transfer of the material thereto. As roller 96 completes its rotation through a printing area, it transfers the material in the form of dots 40 onto the intermediate substrate 36. After the material is transferred from roller 94, that roller passes through an inspection area 104 and any remaining material may be removed using knives 106 or other instruments prior to application of a new material layer. The remaining elements of system 92 are as described above with respect to system 60 shown in FIG. 3a.

Figure 3C:
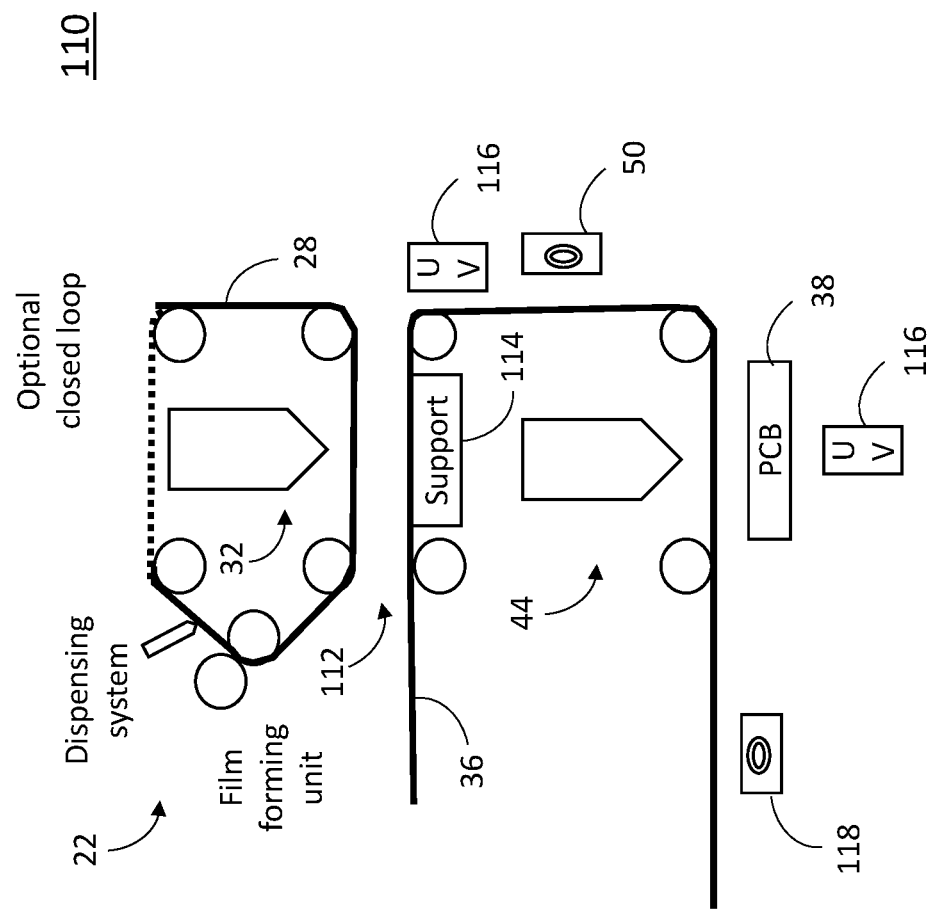

FIG. 3c shows yet another embodiment of the present invention. In this system 110, a coating system 22 creates a uniform layer of the to-be printed material on a donor substrate 28, for example using one of the techniques described above. A first printing unit 32 then prints the material from the uniform layer on donor substrate 28 onto the intermediate substrate 36. In this example, a very well-defined gap 112 may be maintained between the coated donor substrate 28 and the intermediate substrate 36 by the use of a fixed support 114 below the intermediate substrate 36 in the vicinity of the first printing unit 32. Remaining elements of system 110 are as described above and, in this example, the positioning of a UV curing system and/or a drying system 116 for curing of material on the intermediate substrate on its way to the second printing unit 44 is shown. Also shown is a post-second printing imaging system 118 for the intermediate substrate 36, which may be used to ensure the proper transfer of the material from the intermediate substrate to the final substrate 38 by the second printing unit 44.

Figure 3D:
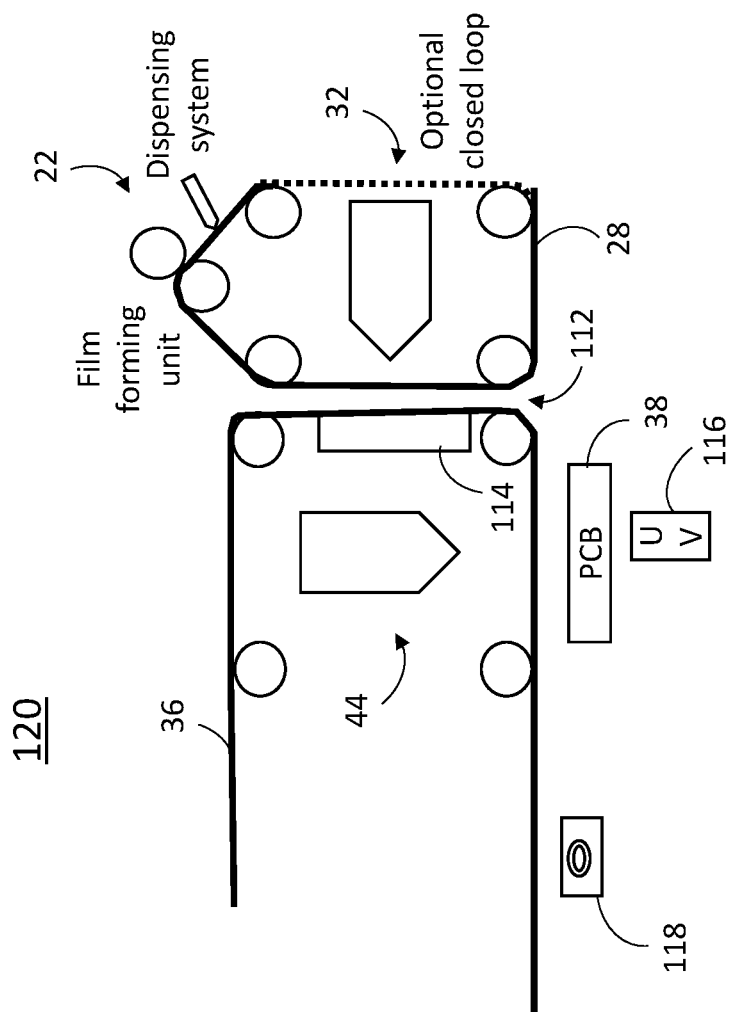

FIG. 3d shows a system 120 configured substantially similar to system 110 shown in FIG. 3c except that in this configuration the first printing by printing unit 32 is done at 90 degrees (or any other orientation) to the gravitational field within which the first printing unit is located. By way of example, in the illustration the gravitational field is assumed to be from the top of the page to the bottom of the page, and the first printing unit is configured to print material from the donor substrate 28 to the intermediate substrate 36 at an angle orthogonal to that gravitational field. This arrangement provides a compact and simpler configuration than is possible with a laser assisted deposition/laser dispensing system printing head as well as some of the other printing systems mentioned above.

Figure 3E:
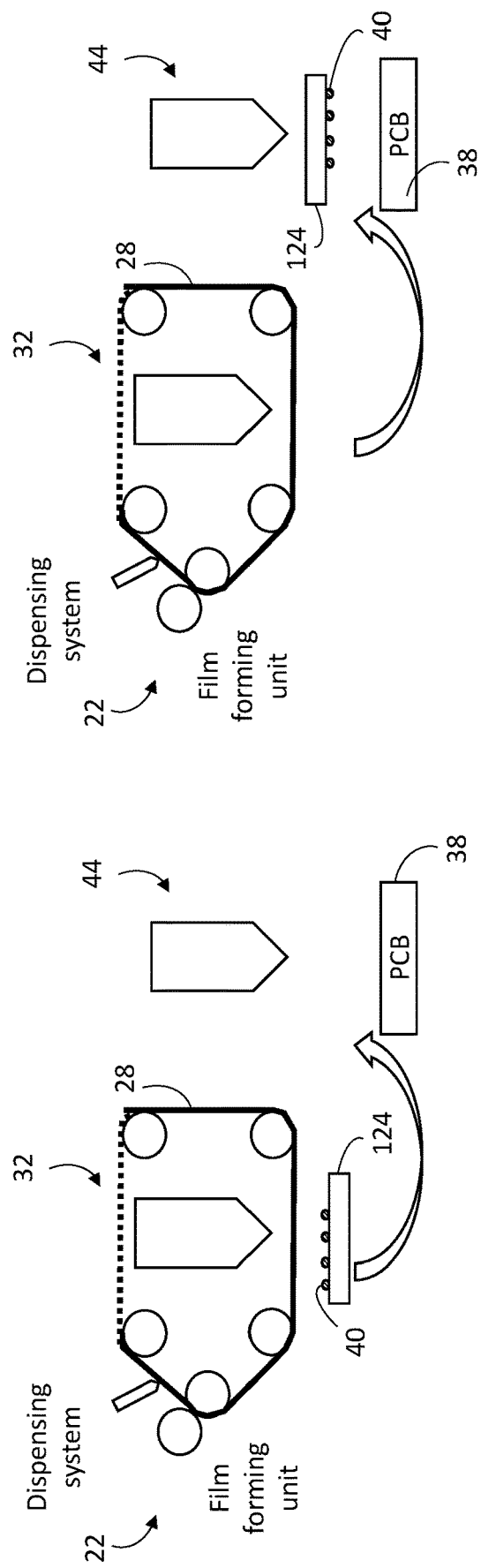

As noted above, the intermediate substrate 36 can be a film but in other instances it may be a transparent solid substrate 124 to ensure a better registration and synchronization between the first and second printing units. FIG. 3e shows printing from a coated donor substrate 28 onto a transparent solid substrate 124 (left-hand view) that is then flipped to create a target for the second printing unit 44 where it used for printing onto the final substrate (right-hand view).

Figure 4A:
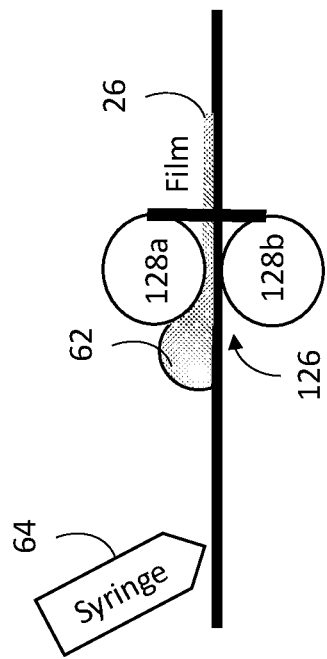
FIGS. 4a and 4b illustrate the creation of a uniform film by placing a material on a film substrate by a syringe (FIG. 4a) and passing the material through a well-defined gap to create a uniform layer (FIG. 4b), in accordance with some embodiments of the present invention.
Figure 4B:
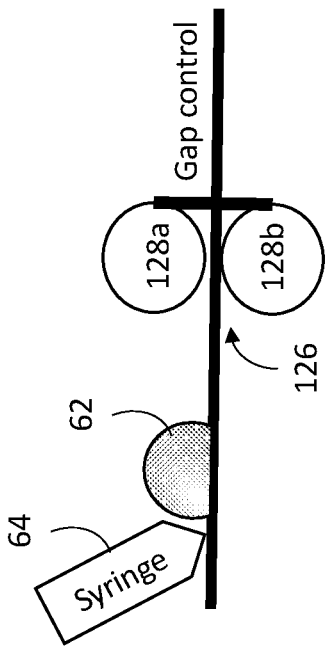

FIGS. 4a and 4b further illustrate the creation of a uniform layer 26 of material on a donor substrate 28 by placing an amount of material 62 on a film substrate 28 using a syringe 64 (FIG. 4a) and passing the material through a well-defined gap 126 to create a uniform layer 26 of material (FIG. 4b), in accordance with some embodiments of the present invention. The well-defined gap 126 is created by bringing a pair of rollers 128a, 128b or knives close together using an appropriate control unit (e.g., a stepper motor or piezo transducer).

FIGS. 5a and 5b illustrate an example of screen printing directly to a film substrate (such as intermediate substrate 36) in accordance with some embodiments of the present invention. In this technique, droplets 132 of a high viscosity material are printed from a screen or grid 130 to form 2D and/or 3D structures on a receiving substrate such as film 134. Initially, a substantially uniform layer of the viscous material is coated on a mesh-like transport screen 130 and retained within the open spaces 140 thereof through adhesion to the mesh surfaces and surface tension. The material-coated mesh 130 is then brought to a working area and into contact with a blade 136 which is passed over the holes of the mesh, causing droplets 132 to be ejected onto the film substrate 134 across a small gap 142. Alternatively, the droplets 140 may be directly printed onto the substrate 134 by bringing it into contact with the mesh-like transport screen 130. With either printing technique, printing may occur one droplet at a time, or one-layer at a time.

The openings 140 in the screen 130 are preferably of uniform size (or nearly so) and may be of regular (e.g., circular, square, rectangular, oval, triangular, etc.) or irregular shape. The screen 130 is typically made of metal (e.g., a metal foil), but may be fabricated from other materials including, but not limited to, plastic, nylon, glass, quartz, etc. In some embodiments, the screen could be made of a plastic foil such as polyethylene terephthalate (PET), polyethylene naphthalate (PEN), or polyimide (e.g., Kapton™). The mesh structure of the screen may be fashioned by laser drilling; in this way, the thickness of the screen and the opening dimensions of the screen may be controlled independently of one another. Preferably, the screen 130 is made of a flexible material so that it can be accommodated on a loop-like conveyor, but in other embodiments a more rigid screen may be used as a transport mechanism which accommodates same may be employed (e.g., an actuator that moves an entire screen at a time in one or two dimensions in a plane). The screen 130 is thus a regular array of openings 140 in each of two planar dimensions and is maintained in tension through appropriate actuators 138 to aid in release of the viscous material according to the shape and volume of the openings as well as the viscosity and composition of the material that fills the openings.

FIG. 6 illustrates an example of a using laser assisted deposition/laser dispensing system 150 to print a material from a grid or mesh-like substrate 156 in accordance with some embodiments of the present invention. In this embodiment, a laser 152 is used to create droplets 154 of high viscosity material, which droplets, when solidified in the aggregate, form 2D and/or 3D structures on a receiving substrate (not shown in this view). In this technique, a substantially uniform layer of the viscous material is coated on a mesh-like transport screen 156 and retained within the open spaces thereof through adhesion to the mesh surfaces and surface tension. The material-coated mesh is then brought to a working area and the laser 152 is used to heat the material within the holes of the mesh, causing droplets to be ejected. More particularly, the focused laser beam is made incident upon the thin layer of viscous material at a small working area, which thin layer of material is transported into the working area using the mesh-like screen 156 with small holes or other openings therein arranged in a periodic fashion. As above, the openings in the screen may be of a desired size according to the application and of regular (e.g., circular, square, rectangular, oval, triangular, etc.) or irregular shape. The screen may be made of metal (e.g., a metal foil), or other materials including, but not limited to, plastic, nylon, glass, quartz, etc. Preferably, the screen is made of a flexible material, but in other embodiments a more rigid screen may be used and a transport mechanism which accommodates same may be employed (e.g., an actuator that moves an entire screen at a time in one or two dimensions in a plane). As the laser is focused onto an opening in the screen 156 (or an area adjacent to an opening) through a transparent (at least at the laser wavelength(s) of interest) substrate 158, the material within the opening is heated causing a droplet 154 to be jetted towards a substrate (not shown in this view). Droplet 154 is approximately the same size as the opening in the screen 156 and has a volume approximately equal to the volume of material contained within the opening. The mesh screen 156 is retained under tension (e.g., lateral strain with respect to the plane of the screen) as it is transported through the working area by one or more actuators. In some instances, the screen transport and tensioning mechanism may be configured to operate in both forward and reverse directions.

FIG. 7 illustrates an example of a using laser jet release system 170 to print a dotted material from a film substrate in accordance with some embodiments of the present invention. In this embodiment, a laser 172 is used to create droplets 174 of high viscosity material, which droplets, when solidified in the aggregate, form 2D and/or 3D structures on a receiving substrate (not shown in this view). In this technique, a substantially regular pattern (e.g., dots 176) of the viscous material is printed or otherwise applied on a transparent substrate 178 (e.g., intermediate substrate 36 from above) and then brought to a working area. The laser 172 is used to heat the interface between the transparent substrate 178 and the material 176, causing the droplets 174 to be ejected. The substrate 178 is transparent at least at the laser wavelength(s) of interest, and heating by the laser 172 causes droplets 174 to be jetted towards a receiver (not shown in this view). The substrate 178 is retained under tension (e.g., lateral strain with respect to the plane of the screen) 180 as it is transported through the working area by one or more actuators. In some instances, the tensioning mechanism may be configured to operate in both forward and reverse directions. The material may be printed or applied to the substrate 178 as a layer of dots 176 or any other shape or form.

Figure 8:
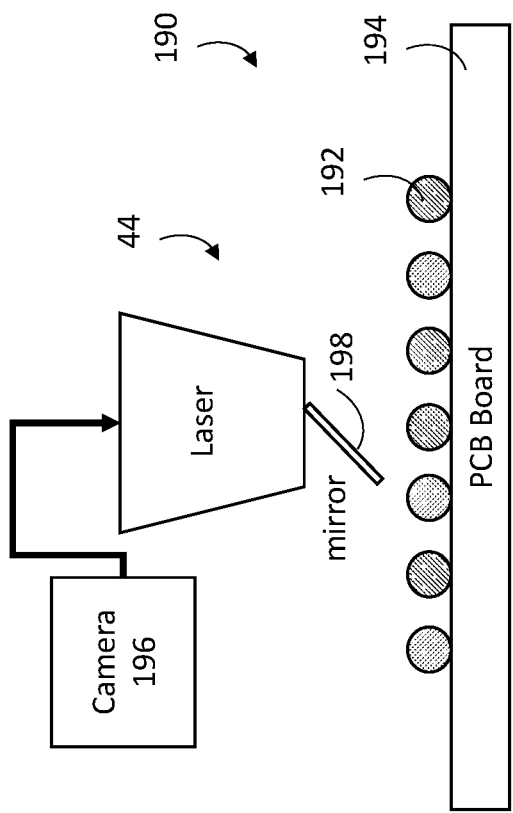
FIG. 8 illustrates aspects of using a main laser channel or a mirror for imaging of dots on a solid or film substrate in accordance with some embodiments of the present invention.

FIG. 8 illustrates aspects of using a main laser channel for imaging of dots on a solid or film substrate in accordance with some embodiments of the present invention. In this example, dots 192 of material have been printed on a solid substrate 194 (e.g., a final substrate 38 such as a PC board) and a camera 196 is used to image the dots via the main laser channel. Alternatively, the camera 196 may be offset from the main laser channel and a semitransparent mirror 198 inserted therein so as to reflect images of the dots 192 towards the camera. Imaging of this kind may be used to ensure optimal placements of the material dots onto the final substrate. The same imaging system can be used to monitor the material on the final substrate from top and/or from the side.

Figure 9:
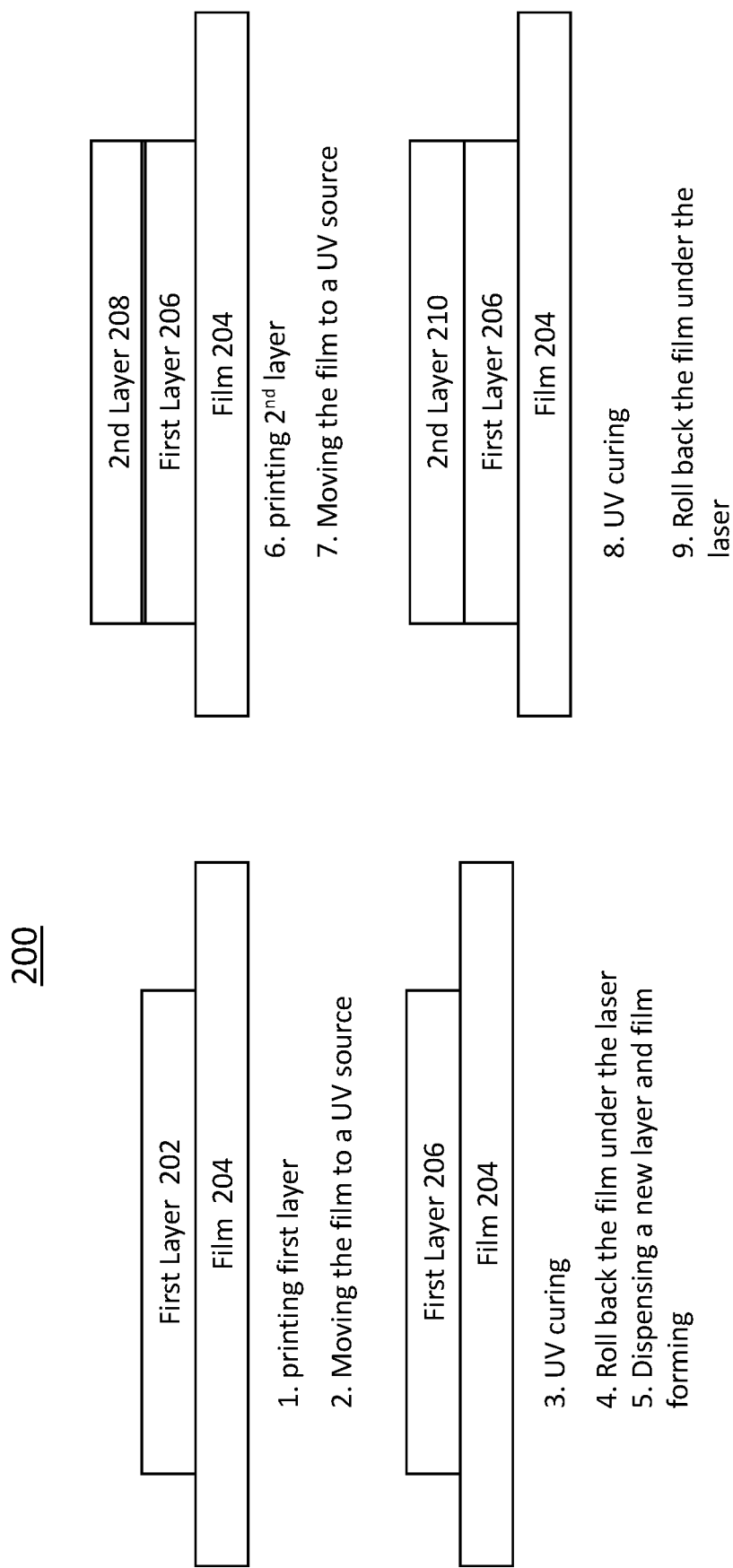
FIG. 9 illustrates aspects of printing a stamp using multiple printed layers with the addition of a UV curing system or a dryer in accordance with some embodiments of the present invention.

The discussion above has primarily concerned systems and methods for printing highly viscous materials at high resolution onto a substrate at a very high speed. However, the same systems and methods can be used for stamp production or for printing multiple materials in the same layer. For example, FIG. 9 illustrates aspects of stamp manufacturing by such a system. At the first stage 200, a shaped layer 202 (not necessarily a dotted matrix) of a UV curable material is printed onto an intermediate substrate 204. The layer is than exposed to a UV source light and cured to form a cured layer 206. Thereafter, the intermediate substrate with the cured layer of material is returned to the first printing unit and a second (or additional) layer 208 of material is dispensed on the coated substrate and printed at the first printing unit. This second/additional layer is then exposed to the UV light source to create a second/additional cured layer of material 210. Multiple layers of the same or different materials can be printed onto the intermediate substrate in this way.

Figure 10:
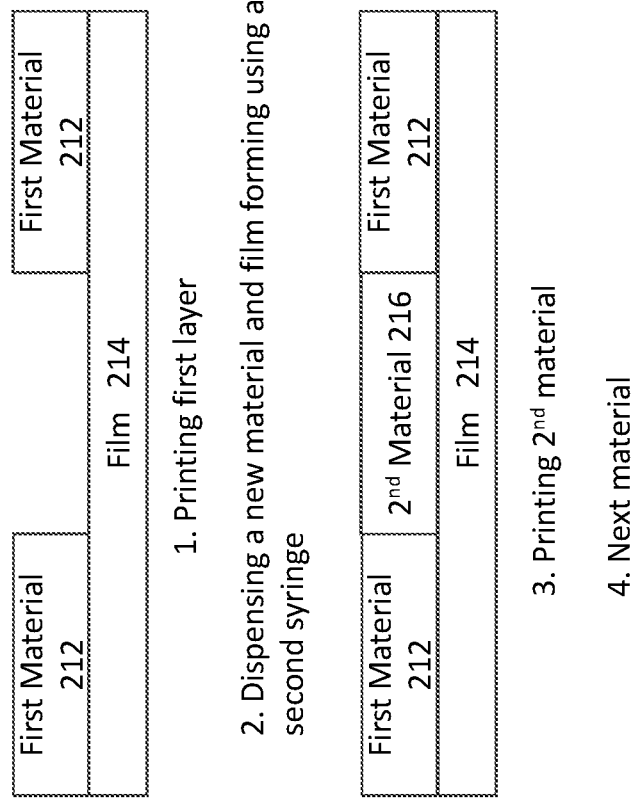
FIG. 10 illustrates aspects of printing multiple materials in the same layer with the addition of a UV curing system or a dryer in accordance with some embodiments of the present invention.

FIG. 10 illustrates the aspects of printing multiple materials in the same layer. One or more sections of a first material 212 is/are printed on a film substrate 214 in the manner explained above, but then the intermediate substrate is returned to the first printing unit and a second (or more) section(s) 216 of a different material is dispensed onto the coated substrate to form a uniform layer. Using this approach, a plurality of materials can be printed onto the final substrate at the same time.

One example of printing multiple materials from an intermediate substrate to the final substrate is adhesives printing. In such instances, a mixture of two materials can initiate a reaction between the materials (for example in an epoxy-amine case or a silanol-Pt catalyst case). The materials are not mixed at the intermediate substrate but only once printed at the final substrate. By doing so, clogging and other unwanted side effects are avoided, and mixing occurs only at the desired place.

Thus, systems and methods for printing a viscous material, such as solder paste, have been described. In various embodiments, these systems and methods employ a multi-step procedure in which the viscous material is dispensed onto a donor substrate and is then printed onto an intermediate substrate before finally being transferred, either in a second printing process or a direct application process to a final substrate. The material can go through one or more steps of curing, drying system and/or imaging system as it proceeds through the various steps in the overall printing process. In order to achieve a very narrow dot size distribution in the printing to the intermediate substrate, it is important to have very well-defined distance control between the coated donor substrate and the intermediate substrate. For that purpose, any of several mechanical solutions can be used. For example, the distance between the coated donor substrate (which may be a film or foil) and the intermediate film may be defined deterministically by having both on the same mechanical part. Alternatively, the distance may be controlled by using mechanical, well-defined foil or two rollers adjacent to each other. Still further, the distance may be controlled by using a plane of three actuators at corners of a support unit that allows both translation and rotation for each substrate and conjugate both into one unit.

To enhance the jetting placement and resolution during printing, an imaging system can be added to monitor the dimensions and placement of the printed dots on the intermediate substrate and on the final substrate. To that end, one or more imaging systems can be added both for monitoring the intermediate substrate and for monitoring the final substrate. The imaging system for the intermediate substrate can use a CCD, a microscope, or a 3D microscope and computer software to monitor the dot size on the intermediate substrate plane and/or the height of the dots at an angle perpendicular to the intermediate substrate plane. The monitoring can also be done before and/or after the second printing unit responsible for transferring the material to the final substrate. The same imaging system can be used to monitor the material on the final substrate from the top and/or from the side. The different imaging solutions are intended to increase the placement success rate and to reduce the need for rework, creating highly reliable and reproducible results.

Although not illustrated in detail, it should be appreciated that the various components of the printing systems described herein operate under the control of one or more controllers, which, preferably, are processor-based controllers that operate under the instruction of machine-executable instructions stored on tangible machine-readable media. Such controllers may include a microprocessor and memory communicatively coupled to one another by a bus or other communication mechanism for communicating information. The memory may include a program store memory, such as a read only memory (ROM) or other static storage device, as well as a dynamic memory, such as a random-access memory (RAM) or other dynamic storage device, and each may be coupled to the bus for providing and storing information and instructions to be executed by the microprocessor. The dynamic memory also may be used for storing temporary variables or other intermediate information during execution of instructions by the microprocessor. Alternatively, or in addition, a storage device, such as a solid state memory, magnetic disk, or optical disk may be provided and coupled to the bus for storing information and instructions. The controller may also include a display, for displaying information to a user, as well as various input devices, including an alphanumeric keyboard and a cursor control device such as a mouse and/or trackpad, as part of a user interface for the printing system. Further, one or more communication interfaces may be included to provide two-way data communication to and from the printing system. For example, network interfaces that include wired and/or wireless modems may be used to provide such communications.

In various embodiments then, the invention provides:

1. Systems and methods that enables printing of a viscous material at high resolution and high speed and which include two printing units and an intermediate substrate that communicates the viscous material between the two printing units.

2. A system including a first printing unit that optionally incorporates a coating unit, and that prints a material on an intermediate substrate, and a second printing unit that receives the intermediate substrate and prints the material therefrom onto a final substrate.

3. The system of embodiment 2, where the first printing unit includes the optional coating system, which is configured to create a uniform layer of the material on a donor substrate.

4. The system of embodiment 3, where the donor substrate is a flexible substrate.

5. The system of embodiment 3, where the coating system includes a syringe of the material and an air or mechanical pump that drives the material onto the donor substrate, which is then transported toward a well-defined gap between rollers or knifes to create a uniform layer of the material with a thickness that is defined by the gap.

6. The system of embodiment 3, where the coating system includes a screen-printing module where the material is coated on a screen or stencil of film with well-defined holes and using a blade or a squeegee, and the material is transferred to the donor substrate in a soft or hard engage.

7. The system of embodiment 3, where the coating system includes a dispenser or an inkjet head to print the material onto the donor substrate.

8. The system of embodiment 3, where the coating system is a gravure or micro-gravure system that coats the donor substrate with a highly uniform layer of the material.

9. The system of embodiment 3, where the coating system is a slot-die system that coats the donor substrate with a highly uniform layer.

10. The system of embodiment 3, where the coating system is a roller coating system that coats the donor substrate with a highly uniform layer.

11. The system of embodiment 3, where the coating system is included inside a closed cell with a controlled environment to prolong the pot life of the material.

12. The system of embodiment 3, where the coating system contains more than one material, creating a possibility for printing a plurality of materials onto the intermediate substrate in controlled sequence and making it possible to print more than one material on the final substrate.

13. The system of embodiment 3, where the intermediate substrate is translatable bi-directionally through the coating system in a controlled manner, for example by opening a gap between coater rollers, thereby providing for recoating the same area of the intermediate substrate with the material without contamination to the rollers to reduce waste.

14. The system of embodiment 2, where the material is a solder paste or other metal paste used for printed electronics.

15. The system of embodiment 2, where the material is a metal paste or a ceramic paste.

16. The system of embodiment 2, where the material is a highly viscous material.

17. The system of embodiment 2, where the material is a wax material.

18. The system of embodiment 2, where the material is a polymer material or a mixture of a polymer and a monomer material.

19. The system of embodiment 2, where the material is a sensitive low viscosity material.

20. The system of embodiment 2, where the material is curable by UV light or by heating.

21. The system of embodiment 2, where the material is one that can be dried.

22. The system of embodiment 2, where the first printing unit is laser-based system that contains a high frequency laser to enable jetting of the material from the donor substrate to the intermediate substrate.

23. The system of embodiment 2, where the first printing unit is a laser assisted deposition/laser dispensing system rotated by 0-90 degrees or 90-180 degrees from a main axis of a gravitational field within which it is located.

24. The system of embodiment 2, where the first printing unit is an inkjet head system configured to jet a material directly to the intermediate substrate.

25. The system of embodiment 2, where the first printing unit is a dispenser head system that prints the material directly to the intermediate substrate.

26. The system of embodiment 2, where the first printing unit is an offset printer module, a gravure printing module, or another printing module that prints the material directly to the intermediate substrate.

27. The system of embodiment 2, where the first printing unit includes a screen-printing module in which the material is coated on a screen or stencil of film with well-defined holes and transferred to the intermediate substrate.

28. The system of embodiment 27, where blade or a squeegee is used to transfer the material to the intermediate substrate in a soft or hard engage creating an array of dots directly on the intermediate substrate.

29. The system of embodiment 2, where the first printing unit includes a gap control unit configured to maintain a well-defined gap between a donor substrate and the intermediate substrate.

30. The system of embodiment 29, where the gap control unit comprises a plane of three actuators that allows both translation and rotation.

31. The system of embodiment 29, where the gap control unit comprises a plane of three actuators at corners of both the donor substrate and the intermediate substrate and which allows both translation and rotation of both the donor substrate and the intermediate substrate.

32. The system of embodiment 31, where the planes of the donor substrate and the intermediate substrate are independent or riding on each other.

33. The system of embodiment 29, where the gap control unit comprises a fixed support below the intermediate substrate.

34. The system of embodiment 2, where the gap control unit comprises a transparent solid substrate as an intermediate substrate.

35. The system of embodiment 2, where a continuous transparent film substrate is used as the intermediate substrate.

36. The system of embodiment 2, where a transparent film substrate coated by a metal layer or by a metal and a dielectric layer is used as the intermediate substrate.

37. The system of embodiment 2, where a transparent solid substrate is used as the intermediate substrate.

38. The system of embodiment 2, where the intermediate substrate after printing at the first printing unit is moved by motors toward the second printing unit.

39. The system of embodiment 2, where the intermediate substrate is a continuous film substrate that by rolling can deliver the material printed at the first printing unit to the second printing unit.

40. The system of embodiment 2, where the intermediate substrate is a transparent solid substrate that can deliver the material printed at the first printing unit to the second printing unit by a robotic arm, with optional change(s) in direction.

41. The system of embodiment 2, where, during movement of the intermediate substrate from the first printing unit to the second printing unit, the material is cured by UV light or dried by a heater.

42. The system of embodiment 2, where, during movement of the intermediate substrate from the first printing unit to the second printing unit, the material is processed by an imaging system.

43. The system of embodiment 42, where the imaging system is a microscope or a CCD that takes a picture of printed dots of the material on the intermediate substrate and measures the dots in 2 dimensions.

44. The system of embodiment 43, where data gathered by the imaging system is transferred to the second printing unit for accurate deposition of the dots of material onto the final substrate.

45. The system of embodiment 42, where the imaging system is a 3D microscope that takes a picture of printed dots of the material on the intermediate substrate and measures the dots in 3 dimensions.

46. The system of embodiment 45, where data gathered by the imaging system is transferred to the second printing unit for accurate deposition of the dots of material onto the final substrate.

47. The system of embodiment 42, where the imaging system is two microscopes or CCDs arranged so that one can take a picture of printed dots of the material on the intermediate substrate and measure the dots in 2 dimensions and the other measures the dots in a direction orthogonal to the 2 dimensions.

48. The system of embodiment 47, where data gathered by the imaging system is transferred to the second printing unit for accurate deposition of the dots of material onto the final substrate.

49. The system of embodiment 42, where the imaging system includes components positioned before and/or after the second printing unit along a path of travel of the material on the intermediate substrate.

50. The system of embodiment 42, where the imaging system is configured to image the intermediate substrate, the final substrate, or both.

51. The system of embodiment 42, where at least portions of the imaging system located at the second printing unit include a mirror arranged to permit imaging a surface of the intermediate substrate, or, by using a main laser channel of the second printing unit, imaging dimensions of dots of material and a target area of the final substrate simultaneously.

52. The system of embodiment 2, where the second printing unit is a laser-based system that contains a high frequency laser to enable jetting of dots of the material from the intermediate substrate to the final substrate.

53. The system of embodiment 2, where the second printing unit is a laser jet release system.

54. The system of embodiment 2, where the second printing unit is a laser jet release system with 2D array scan laser.

55. The system of embodiment 2, where the second printing unit is a laser jet release system rotated by 0-90 degrees or 90-180 degrees from a main axis of a gravitational field within which it is located.

56. The system of embodiment 2, where the second printing unit comprises a deposition position at which the intermediate substrate engages the final substrate directly.

57. The system of embodiment 2, where after printing of the material to the final substrate in the second printing unit, the printed final substrate is cured by UV light or dried by a heater.

58. The system of embodiment 2, where after printing of the material to the intermediate substrate in the first printing unit the printed intermediate substrate is cured by UV light or dried by a heater and returned to the first printing unit for printing of a second (or additional) layer of a second material which may be different from the material.

59. A method comprising: at a first printing unit printing a viscous material on an intermediate substrate, and subsequently moving the printed material on the intermediate substrate to a second printing unit and there printing the material onto a final substrate, wherein the first printing unit optionally may include a coating unit.

60. The method of embodiment 59, where the intermediate substrate is a flexible substrate.

61. The method of embodiment 59, where the first printing unit includes the coating unit, and the coating unit creates a uniform layer of the material on a donor substrate.

62. The method of embodiment 59, where the first printing unit includes the coating unit, and the coating unit includes a syringe of the material and an air or mechanical pump that drives the material from the syringe onto a donor substrate, which is moved using motors toward a well-defined gap between rollers or knifes to create a uniform layer of the material with a thickness that is defined by the gap on the donor substrate.

63. The method of embodiment 59, where the first printing unit includes the coating unit, and the coating unit includes a screen-printing module where the material is coated on a screen or stencil of film with well-defined holes and a blade or a squeegee is used to the material to the intermediate substrate in a soft or hard engage.

64. The method of embodiment 59, where the first printing unit includes the coating unit, and the coating unit includes a dispenser or an inkjet head to print the material onto a donor substrate.

65. The method of embodiment 59, where the first printing unit includes the coating unit, and the coating unit is a gravure or micro-gravure system that coats a donor substrate with a highly uniform layer of the material.

66. The method of embodiment 59, where the first printing unit includes the coating unit, and the coating unit is a slot-die system that coats a donor substrate with a highly uniform layer of the material.

67. The method of embodiment 59, where the first printing unit includes the coating unit, and the coating unit is a roller coating system that coats a donor substrate with a highly uniform layer of the material.

68. The method of embodiment 59, where the first printing unit includes the coating unit, and the coating unit is inside a closed cell with a controlled environment to prolong the pot life of the material.

69. The method of embodiment 59, where the first printing unit includes the coating unit, and the coating unit contains more than one material, creating a possibility for printing a plurality of materials onto the intermediate substrate in a controlled sequence and making it possible to print more than one material onto the final substrate.

70. The method of embodiment 59, where the first printing unit includes the coating unit, and a donor substrate is bi-directionally translatable through the coating unit in a controlled manner while a gap between coater rollers is open, creating the possibility for recoating the same area of the donor substrate with the material without contamination to the rollers.

71. The method of embodiment 59, where the material is a solder paste or other metal pastes used for printed electronics.

72. The method of embodiment 59, where the material is a metal paste or a ceramic paste.

73. The method of embodiment 59, where the material is a highly viscous material.

74. The method of embodiment 59, where the material is a wax material.

75. The method of embodiment 59, where the material is a polymer material or a mixture of a polymer and a monomer material.

76. The method of embodiment 59, where the material is a sensitive low viscosity material.

77. The method of embodiment 59, where the material is a material that can be cured by UV light or by heating.

78. The method of embodiment 59, where the material is a material that can be dried.

79. The method of embodiment 59, where the first printing unit is laser-based system that contains a high frequency laser configured to jet the material from a donor substrate to the intermediate substrate.

80. The method of embodiment 59, where the first printing unit is a laser assisted deposition/laser dispensing system rotated by 0-90 degrees or 90-180 degrees from a main axis of a gravitational field within which it is located.

81. The method of embodiment 59, where the first printing unit is an inkjet head system configured to jet the material directly to the intermediate substrate.

82. The method of embodiment 59, where the first printing unit is a dispenser head system configured to print the material directly to the intermediate substrate.

83. The method of embodiment 59, where the first printing unit is an offset printer module, a gravure printing module, or another printing module configured to print the material directly to the intermediate substrate.

84. The method of embodiment 59, where the first printing unit includes a screen-printing module, and the material is coated on a screen or stencil of film with well-defined holes and transferred to the intermediate substrate.

85. The method of embodiment 84, where a blade or a squeegee is used to transfer the material to the intermediate substrate in a soft or hard engage, creating an array of dots of the material directly on the intermediate substrate.

86. The method of embodiment 59, where the first printing unit includes a control unit configured to maintain a very well-defined gap between a donor substrate and the intermediate substrate.

87. The method of embodiment 86, where the gap control unit maintains the very well-defined gap between the donor substrate and the intermediate substrate by a plane of three actuators at its corners that allows both translation and rotation.

88. The method of embodiment 86, where the gap control unit maintains the very well-defined gap between the donor substrate and the intermediate substrate by a plane of three actuators at corners of both the donor substrate and the intermediate substrate to allows both translation and rotation of both the donor substrate and the intermediate substrate.

89. The method of embodiment 88, where planes of both the donor substrate and the intermediate substrate are independent or riding on each other.

90. The method of embodiment 86, where the gap control unit maintains the very well-defined gap between the donor substrate and the intermediate substrate using a fixed support below the intermediate substrate.

91. The method of embodiment 86, where the gap control unit maintains the very well-defined gap between the donor substrate and the intermediate substrate using a transparent solid substrate as the intermediate substrate.

92. The method of embodiment 59, where a continuous transparent film substrate is used as the intermediate substrate for the system.

93. The method of embodiment 59, where a transparent film substrate coated by a metal layer or by a metal and a dielectric layer is used as the intermediate substrate.

94. The method of embodiment 59, where a transparent solid substrate is used as the intermediate substrate.

95. The method of embodiment 59, where the intermediate substrate, after printing at the first printing unit, is moved by motors toward the second printing unit.

96. The method of embodiment 59, where the intermediate substrate is a continuous film substrate that by rolling delivers the material printed at the first printing unit to the second printing unit.

97. The method of embodiment 59, where the intermediate substrate is a transparent solid substrate that delivers the material printed at the first printing unit to the second printing unit by a robotic arm with optional change(s) in direction.

98. The method of embodiment 59, where, during the movement of the intermediate substrate from the first printing unit to the second printing unit, the material is cured by UV light or dried by a heater.

99. The method of embodiment 59, where, during the movement of the intermediate substrate from the first printing unit to the second printing unit, the material is processed by an imaging system.

100. The method of embodiment 99, where the imaging system is a microscope or a CCD that takes a picture of dots of printed material on the intermediate substrate and measures the dots in 2 dimensions.

101. The method of embodiment 100, where data gathered by the imaging system is transferred to the second printing unit for accurate deposition of the dots of material onto the final substrate.

102. The method of embodiment 99, where the imaging system is a 3D microscope that takes a picture of dots of printed material on the intermediate substrate and measures the dots in 3 dimensions.

103. The method of embodiment 102, where data gathered by the imaging system is transferred to the second printing unit for accurate deposition of the dots of material onto the final substrate.

104. The method of embodiment 5999 where the imaging system is two microscopes or CCDs arranged so that one takes a picture of dots of printed material on the intermediate substrate and measures the dots in 2 dimensions and the other measures the dots in a direction orthogonal to both of the 2 dimensions.

105. The method of embodiment 104, where data gathered by the imaging system is transferred to the second printing unit for accurate deposition of the dots of material onto the final substrate.

106. The method of embodiment 99, where components of the imaging system are located before and/or after the second printing unit.

107. The method of embodiment 99, where the imaging system takes images from the intermediate substrate, the final substrate, or from both.

108. The method of embodiment 99, where the imaging system is located at the second printing unit and uses a mirror to image a surface of the intermediate substrate or, by using a main laser channel of the second printing unit, to image both dots of the material and a target area of the final substrate simultaneously.

109. The method of embodiment 59, where the second printing unit is laser-based system that contains a high frequency laser to jet dots of the material from the intermediate substrate to the final substrate.

110. The method of embodiment 59, where the second printing unit is a laser jet release system.

111. The method of embodiment 59, where the second printing unit is a laser jet release system with 2D array scan laser.

112. The method of embodiment 59, where the second printing unit is a laser jet release system rotated by 0-90 degrees or 90-180 degrees from a main axis of a gravitational field within which it is located.

113. The method of embodiment 59, where the second printing unit comprises a deposition position at which the intermediate substrate engages the final substrate directly.

114. The method of embodiment 59, where, after printing to the final substrate in the second printing unit, the printed final substrate is cured by UV light or dried by a heater.

115. The method of embodiment 59, where, after printing to the intermediate substrate in the first printing unit, the printed intermediate substrate is cured by UV light or dried by a heater and returned to the first printing unit for printing of a second (or additional) layer of a second material which may be different from the material.

What is claimed is:

1. A system, comprising a first printing unit configured to print individual dots of a material on an intermediate substrate, and a second printing unit configured to receive the intermediate substrate having the dots of material printed thereon and to transfer the dots of material from the intermediate substrate to a final substrate, wherein the first printing unit includes a coating system configured to create a uniform layer of the material on a donor substrate, and the first printing unit is further configured to transfer the material in the individual dots from the donor substrate onto the intermediate substrate, and wherein the coating system includes a syringe of the material and an air or mechanical pump arranged to drive the material onto the donor substrate, and the coating system is further configured to transport the donor substrate with the material thereon towards and through a first gap between rollers or knifes to create a uniform layer of the material on the donor substrate, the uniform layer of the material having a thickness that is defined by the first gap.

2. The system of claim 1, wherein the coating system is enclosed in a controlled environment.

3. The system of claim 1, wherein the coating system is configured to apply more than one material onto the donor substrate in a plurality of printing procedures.

4. The system of claim 1, wherein the material comprises an ultra-violet (UV) light curable or heat curable material.

5. The system of claim 1, wherein at least one of the first printing unit or the second printing unit comprises a laser-based system that includes a high frequency laser configured to jet the dots of material from one substrate to another substrate.

6. The system of claim 1, wherein at least one of the first printing unit or the second printing unit is a laser assisted deposition/laser dispensing system rotated by 0-90 degrees or 90-180 degrees from a main axis of a gravitational field within which it is located.

7. The system of claim 1, wherein the first printing unit is configured to maintain a second gap between the donor substrate and the intermediate substrate.

8. The system of claim 1, further comprising rollers to deliver the dots of material printed on the intermediate substrate at the first printing unit to the second printing unit, wherein the intermediate substrate is a continuous film substrate.

9. The system of claim 1, further comprising ultra-violet (UV) lights arranged to at least one of (i) cure the dots of material printed on the intermediate substrate during movement of the intermediate substrate from the first printing unit to the second printing unit, or (ii) cure the final substrate after transfer of the dots of material thereto.

10. The system of claim 1, further comprising at least one imaging system arranged to image at least one of (i) the dots of material printed on the intermediate substrate during movement of the intermediate substrate from the first printing unit to the second printing unit, or (ii) the dots of material after transfer to the final substrate.

11. The system of claim 10, wherein the at least one imaging system is configured to measure the dots of material printed on the intermediate substrate during movement of the intermediate substrate from the first printing unit to the second printing unit in two or three dimensions and to transfer data gathered by said measuring to the second printing unit for use in transfer of the dots of material onto the final substrate.

12. The system of claim 1, further comprising a heater arranged to at least one of (i) cure the dots of material printed on the intermediate substrate during movement of the intermediate substrate from the first printing unit to the second printing unit, or (ii) cure the final substrate after transfer of the dots of material thereto.

* * * * *